(12) United States Patent
Liao et al.

(10) Patent No.: US 8,169,835 B2
(45) Date of Patent: May 1, 2012

(54) CHARGE TRAPPING MEMORY CELL HAVING BANDGAP ENGINEERED TUNNELING STRUCTURE WITH OXYNITRIDE ISOLATION LAYER

(75) Inventors: Jeng-Hwa Liao, Hsinchu (TW); Jung-Yu Shieh, Hsinchu (TW); Ling-Wuu Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 409 days.

(21) Appl. No.: 12/568,272

(22) Filed: Sep. 28, 2009

(65) Prior Publication Data

US 2011/0075486 A1 Mar. 31, 2011

(51) Int. Cl.
*G11C 16/04* (2006.01)

(52) U.S. Cl. ......... 365/185.28; 365/185.29; 365/185.18; 365/185.27

(58) Field of Classification Search .......... 365/185.26–185.29, 185.18; 257/324–326; 438/261, 287, 257
See application file for complete search history.

(56) References Cited

U.S. PATENT DOCUMENTS

| | | | |
|---|---|---|---|
| 6,912,163 | B2 | 6/2005 | Zheng et al. |
| 7,075,828 | B2 | 7/2006 | Lue et al. |
| 7,164,603 | B2 | 1/2007 | Shih et al. |
| 7,184,316 | B2 * | 2/2007 | Cho et al. .......... 365/185.28 |
| 2006/0198189 | A1 | 9/2006 | Lue et al. |
| 2006/0261401 | A1 | 11/2006 | Bhattacharyya |
| 2006/0281260 | A1 | 12/2006 | Lue |
| 2007/0268753 | A1 | 11/2007 | Lue et al. |
| 2009/0059676 | A1 | 3/2009 | Lai et al. |

OTHER PUBLICATIONS

Guo, Xin, "Tunneling Leakage Current in Oxynitride: Dependence on Oxygen/Nitrogen Content," IEEE Electron Device Lett. vol. 19, No. 6, Jun. 1998, 3 pages.
Lue, Hang-Ting et al., "Understanding barrier engineered charge-trapping NAND flash devices with and without high-K dielectric," 2009 IEEE International Reliability Physics Symposium, Apr. 26-30, 2009, pp. 874-882.
Lue, Hang-Ting, et al., "A Transient Analysis Method to Characterize the Trap Vertical Location in Nitride-Trapping Devices," IEEE Electron Device Lett. vol. 25, No. 12, Dec. 2004, 3 pages.
Lue, Hang-Ting, et al., "BE-SONOS: A Bandgap Engineered SONOS with Excellent Performance and Reliability," IEEE IEDM Technical Digest Dec. 5-7, 2005, 4 pages.
Mirsch, S, et al., "Properties of Silicon Nitride and Silicon Oxynitride Films Prepared by Reactive Sputtering," phys. stat sol. (a) 26, 579-584, Sep. 1974.
Shin, Yoocheol et al., "A Novel NAND-type MONOS Memory using 63nm Process Technology for Multi-Gigabit Flash EEPROMs," IEEE Dec. 5, 2005, 4 pages.
Shin, Yoocheol, et al., "High Reliable SONOS-type NAND Flash Memory Cell with Al2O3 for Top Oxide," IEEE IEDM Feb. 16-20, 2003, 2 pages.
Wang, Szu-Wang, et al., "Reliability and Processing Effects of Bandgap Engineered SONOS (BE-SONOS) Flash Memory," 2007 IEEE 45th Annual Physics Symp, Apr. 15-19, 2007, 6 pages.

* cited by examiner

*Primary Examiner* — David Lam
(74) *Attorney, Agent, or Firm* — Haynes Beffel & Wolfeld LLP

(57) ABSTRACT

A band gap engineered, charge trapping memory cell includes a charge storage structure including a trapping layer, a blocking layer, and a dielectric tunneling structure including a thin tunneling layer, a thin bandgap offset layer and a thin isolation layer comprising silicon oxynitride. The memory cell is manufactured using low thermal budget processes.

19 Claims, 18 Drawing Sheets

CHARGE TRAPPING MEMORY CELL HAVING BANDGAP ENGINEERED TUNNELING STRUCTURE WITH OXYNITRIDE ISOLATION LAYER

BACKGROUND OF THE INVENTION

1. Field of the Invention

The present invention relates to flash memory technology, and more particularly to scalable charge trapping memory technology adaptable for high speed erase and program operations.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This interference limits the ability to increase the density of flash memory based on floating gate memory cells. Another type of memory cell used for flash memory can be referred to as a charge trapping flash memory cell, which uses a dielectric charge trapping layer in place of the floating gate. Charge trapping memory cells use dielectric charge trapping material that causes much less cell-to-cell interference than that encountered with floating gate technology, and is expected to be applied for higher density flash memory.

The typical charge trapping memory cell consists of a field effect transistor FET structure having a source and drain separated by a channel, and a gate separated from the channel by a stack of dielectric material including a tunnel dielectric layer, the charge storage layer, and a blocking dielectric layer. According to the early designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed a silicon oxide (O), and the gate comprises polysilicon (S). The SONOS device is programmed by electron tunneling using one of a number of well-known biasing technologies, and erased by hole tunneling or electron de-trapping. In order to achieve practical operational speeds for the erase operation, the tunneling dielectric layer must be quite thin (less than 3 nm). However at that thickness, the endurance and charge retention characteristics of the memory cell are poor relative to traditional floating gate technology. On the other hand, the electric field required for the erase operation using thicker tunneling dielectric layers also causes electron injection from the gate through the blocking dielectric layer. This electron injection causes an erase saturation condition in which the charge level in the charge trapping device converges on an equilibrium level. See, U.S. Pat. No. 7,075,828, entitled "Operation Scheme with Charge Balancing Erase for Charge Trapping Non-Volatile Memory", invented by Lue et al. However, if the erase saturation level is too high, the cell cannot be erased at all, or the threshold margin between the programmed and erased states becomes too small for many applications.

Technology has been investigated to improve the ability of the blocking dielectric layer to reduce electron injection from the gate for the high electric fields needed for erase. See, U.S. Pat. No. 6,912,163, entitled "Memory Device Having High Work Function Gate and Method of Erasing Same," Invented by Zheng et al., issued 28 Jun. 2005; and U.S. Pat. No. 7,164,603, entitled "Operation Scheme with High Work Function Gate and Charge Balancing for Charge Trapping Non-Volatile Memory", invented by Shih et al., Shin et al., "A Highly Reliable SONOS-type NAND Flash Memory Cell with $Al_2O_3$ or Top Oxide," IEDM, 2003 (MANOS); and Shin et al., "A Novel NAND-type MONOS Memory using 63 nm Process Technology for a Multi-Gigabit Flash EEPROMs", IEEE 2005.

Also, technology has been investigated to improve the performance of the tunneling dielectric layer for erase at lower electric fields. See, U.S. Patent Application Publication No. US 2006/0198189 A1, "Non-Volatile Memory Cells, Memory Arrays Including the Same and Method of Operating Cells and Arrays," Invented by Lue et al., publication date Sep. 7, 2006 (describing a "BE-SONOS device"); Lue et al., "BE-SONOS: A Bandgap Engineered SONOS with Excellent Performance and Reliability", IEEE, December 2005; Wang et al., "Reliability and Processing Effects of the Bandgap Engineered SONOS (BE-SONOS) Flash Memory," IEEE, May 2007. See also, U.S. Patent Application Publication No. 2006/0261401 A1, entitled "Novel Low Power Non-Volatile Memory and Gate Stack", by Bhattacharyya, published 23 Nov. 2006. BE-SONOS devices have a three layer dielectric tunneling structure that, as explained in more detail below, includes a first layer of silicon dioxide, typically less than 1.5 nm thick (called herein the "tunneling layer"), a layer of silicon nitride, typically less than 2.5 nm thick (called herein the "band offset layer"), and a third layer of silicon dioxide, typically less than 3 nm thick (called herein the "isolation layer"). Significant performance improvements have been provided by this 3 layer structure, relative to the single layer tunneling dielectric, and other attempts at engineering the tunneling dielectric, by taking advantage of the complex tunneling behavior during relatively low electric field operating modes in which charge retention is necessary, during relatively high positive electric field operating modes in which charge tunneling to increase the device threshold is required, and during relatively high negative electric field operating modes in which charge tunneling to decrease device threshold is required.

BE-SONOS technology has been proven to provide excellent performance, overcoming many of the erase speed, endurance and charge retention issues of prior art SONOS type memory. While the BE-SONOS structure provides excellent reliability, the erase speed remains limited. So, it is desirable to further improve erase speeds for charge trapping memory cells, without sacrificing endurance and retention, so that speeds approach those possible using floating gate technologies.

SUMMARY OF THE INVENTION

The performance achieved using BE-SONOS devices characterized by having a dielectric tunneling structure including a tunneling layer, a band offset layer and an isolation layer as described above, is further improved by engineering the isolation layer, replacing the pure silicon oxide layer with a silicon oxynitride ($SiO_xN_y$— hereinafter SiON), where the thickness of the isolation layer and the concentration of nitrogen are set so that charge retention is maintained or improved and hole tunneling erase speeds are increased.

SiON can be fabricated with ranges in values for the dielectric constant K, the band gap, and the conduction band and valence band barrier heights ranging from those of silicon dioxide $SiO2$ and silicon nitride $Si3N4$. By reducing the valence band barrier height (increasing nitrogen concentration), the speed of erase by hole tunneling is improved. Meanwhile, the SiON isolation layer can be implemented with sufficient barrier height and thickness to prevent charge loss during operating modes in which charge retention is important.

Thus, an improved bandgap engineered tunneling dielectric is provided including a combination of materials having negligible charge trapping efficiency, and band offset characteristics. The band offset characteristics include a relatively large hole tunneling barrier height in a thin region at the interface with the semiconductor body (tunneling layer), and an increase in valence band energy level so that the hole tunneling barrier height at a first offset less than 2 nm for example from the interface with the semiconductor body is relatively low (band offset layer). The band offset characteristics also include an increase in conduction band energy by providing a thin layer (isolation layer) of silicon oxynitride with a relatively high electron tunneling barrier height at a second offset more than 2 nm from the channel surface, separating the material with a relatively lower hole tunneling barrier height from the charge trapping layer.

The valence band energy level at the first offset is such that an electric field sufficient to induce hole tunneling through the thin region between the interface with the semiconductor body and the offset, is also sufficient to raise the valence band energy level after the offset to a level that effectively eliminates the hole tunneling barrier in the engineered tunneling dielectric after the offset at lower electric field magnitudes than are possible using the prior art BE-SONOS devices. This structure enables electric field assisted hole tunneling at high speeds while effectively preventing charge leakage (improving data retention) through the engineered tunneling dielectric in the absence of electric fields or in the presence of smaller electric fields induced for the purpose of other operations, such as reading data from the cell or programming adjacent cells.

A charge trapping memory described herein comprises an array of memory cells, respective memory cells in the array including a semiconductor body including a channel having a channel surface; a gate; and a data storage structure between the channel region and the gate, the data storage structure comprising a tunnel dielectric structure; a dielectric charge trapping layer on the tunnel dielectric structure; and a blocking dielectric layer on the charge trapping layer. The tunnel dielectric structure includes a first layer of silicon dioxide having a hole tunneling barrier height, a second layer of silicon nitride or silicon oxynitride having a hole tunneling barrier height less than that of the first layer, and a third layer of silicon oxynitride, the silicon oxynitride having a hole tunneling barrier height greater than that of the second layer and less than that of the first layer.

In a representative device, the engineered tunneling dielectric layer consists of an ultrathin silicon oxide layer O1 (e.g. <=1.5 nm), an ultrathin silicon nitride layer N1 (e.g. <=3 nm) and an ultrathin SiON layer O2 (e.g. <=4 nm), which results in an increase in the valence band energy level of about 2.6 eV at an offset 1.5 nm or less, from the interface with the semiconductor body. The O2 layer separates the N1 layer from the charge trapping layer, at a second offset (e.g. about 3.5 to 4.5 nm from the interface), by a region of lower valence band energy level (higher hole tunneling barrier) and higher conduction band energy level. The electric field sufficient to induce hole tunneling between the interface and the first offset also raises the valence band energy level after the second offset to a level that effectively eliminates the hole tunneling barrier, because the second offset is at a greater distance from the interface. Therefore, the O2 layer comprises SiON that has a thickness (e.g. about 3.5 nm) sufficient to assist in preventing tunneling out of the charge trapping layer during retention conditions, and has a valence band level as described above that is less negative than that of the band offset layer and less positive than that of the tunneling layer. The third layer consists of silicon oxynitride having an index of refraction less than 1.72 and has a thickness greater than 2.5 nanometers. The third layer consists of silicon oxynitride preferably having an index of refraction in an inclusive range from to 1.5 to 1.63.

The index of refraction of the SiON layer is a common measure of the concentration of nitrogen and concentration of oxygen in the SiON material. The index of refraction is dependent on wavelength to some degree. So, the index of refraction at a wavelength of nominally 633 nanometers is used for this purpose. For thin films, the index of refraction can be difficult to measure. Thus, as used herein, the concentration of nitrogen or oxygen in a SiON layer as represented by a value of the index of refraction, is that concentration occurring in SiON having that index of refraction at about 633 nm within reasonable measurement uncertainties. It is known that the conduction band barrier height of SiON increases monotonically with increasing concentration of oxygen, and the dielectric constant of SiON decreases monotonically with increasing concentration of oxygen. Also, the refractive index decreases with increasing concentration of oxygen.

The data storage structure is capable of use in an operating mode in which an electric field across the data storage structure induces hole tunneling through the first layer sufficient to lower a threshold voltage of the memory cell by more than 4 volts in less than one millisecond under electric fields with a magnitude between 10 MV/cm and 14 MV/cm to induce said hole tunneling.

Control circuitry and bias circuitry are coupled to the array of memory cells to apply bias voltages to selected memory cells for read, program and erase operations.

A method for manufacturing memory cells as described herein is also provided.

Other aspects and advantages of the present invention can be seen on review of the drawings, the detailed description in the claims which follow.

DETAILED DESCRIPTION

A detailed description of embodiments of the present invention is provided with reference to the FIGS. 1-24.

Figure 1:
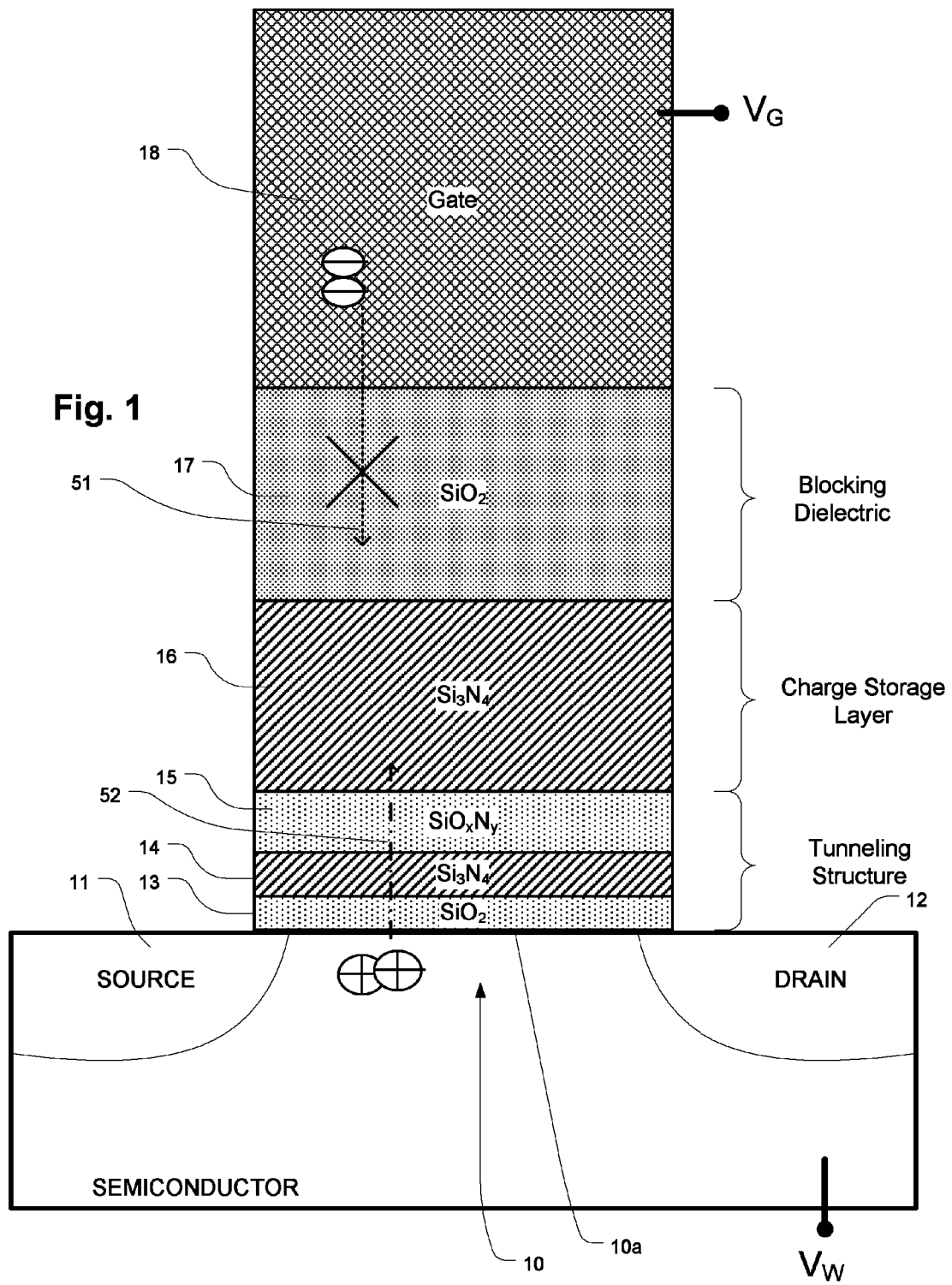
FIG. 1 is a simplified diagram of an embodiment of a memory cell according to the present invention.

FIG. 1 is a simplified diagram of a charge trapping memory cell employing a band gap engineered dielectric tunneling layer, including an isolation layer consisting of SiON. The memory cell includes a channel 10 in a semiconductor body, and a source 11 and a drain 12 adjacent channel. FIG. 1 includes schematic symbols for hole tunneling 52 in the dielectric tunneling structure (layers 13-15) and electron tunneling 51 in the blocking layer 17 as induced in an erase process, discussed below.

A gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials. For some applications, it is preferable to use materials having work functions higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 1, the dielectric tunneling layer comprises a composite of materials, including a first layer 13, referred to as the hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 2 nm, and preferably 1.5 nm or less.

A second layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680 degrees C. In alternative processes, the band offset layer comprises silicon oxynitride, made using a similar process with an $N_2O$ precursor. The thickness of the layer 14 of silicon nitride is less than 3 nm, and preferably between about 1.5 and 2.5 nm. In embodiments made using silicon oxynitride, the concentration of nitrogen should be relatively high, such as greater than that required to establish an index of refraction of 1.72.

A third layer 15 of SiON, referred to as an isolation layer, lies on the layer 14 of silicon nitride formed for example using a single wafer rapid thermal process RTP low pressure chemical vapor deposition LPCVD with a significantly smaller thermal budget than used for silicon oxide formation with high temperature oxide HTO processes used in prior art BE-SONOS devices. The third layer 15 is preferably a stoichiometric SiON material, which can be represented by the formula: $SiO_xN_y$, where $2x+3y=4$. The thickness of the third layer 15 of SiON is 2.5 nm or more in embodiments described here, including for example between 3 and 4 nm, and specifically about 3.5 nm. A method of forming the SiON third layer 15 includes using a mixture of silane ($SiH_4$), nitrous oxide ($N_2O$) and ammonia ($NH_3$) as reactant gas. The ratio of volumetric flow rate of $N_2O$ to combined volumetric flow rate of ($N_2O+NH_3$) used to form the SiON third layer 15 can be varied from 0.0245 to 0.375 for example, for a constant volumetric flow rate of $SiH_4$, depending on the desired concentration of nitrogen desired for the SiON third layer 15 to be formed. The ratio of volumetric flow rate of $SiH_4$ to combined volumetric flow rate of ($N_2O+NH_3$) for forming the SiON third layer 15 is within a range of 1:2000 to 6:2000, possibly 4:2000. The formation of the SiON third layer 15 can be carried out in a single-wafer LPCVD chamber, for example. Also, an inert gas, such as argon (Ar) or helium (He), can be introduced into the single-wafer LPCVD chamber as a diluting gas or a carrier gas during the formation of the SiON third layer 15. A process pressure set in the formation of the SiON third layer 15 can be within a range of 50 Torr to 200 Torr. A process temperature set in the formation of the SiON third layer 15 can be within a range of 700° C. to 900° C., possibly 800° C.

As discussed in more detail below, the SiON has a concentration of nitrogen in one exemplary embodiment that establishes an index of refraction about 1.63. The concentration of nitrogen is selected so that the valence band transitions to a more negative level in the interface between the second layer 14 and the third layer 15, providing a higher hole tunneling barrier in the third layer 15 than in the second layer 14. Also, the concentration of nitrogen is selected so that charge trapping is negligible in the tunneling structure comprising a first layer 13, second layer 14 and third layer 15. In examples described below, the critical threshold for the concentration of nitrogen in the SiON of the third layer 15 at which charge trapping is negligible is less than 1.72 and greater than or equal to 1.63. Also, the critical threshold for concentration of nitrogen in the SiON of the third layer 15 at which improvements in erase speed are found for the structure tested occurs at an index of refraction greater than 1.5. The SiON-based BE-SONOS device displays an increased program/erase speed with increasing the index of refraction of the SiON third layer 15 above n=1.50. By tuning the character of the SiON third layer, program time can be reduced by one-half and erase time can be reduced by 10 times relative to similar tested devices with a silicon dioxide third layer. Also, a lower erase saturation can be obtained for SiON-based BE-SONOS devices.

The charge loss under 150° C. bake testing increases with increasing refractive index of a 2.5 nm SiON third layer 15. However, increasing the thickness of SiON third layer 15 from 2.5 nm to 3.5 nm significantly reduces the charge loss for n≦1.63, and shows retention characteristics as good or better than that of conventional BE-SONOS.

The structure and function of the dielectric tunneling structure can be understood in more detail with reference to the discussion of FIGS. 3 through 7.

A charge trapping layer 16 in this embodiment comprises silicon nitride having a thickness of about 5 nm, or more including for example about 7 nm in this embodiment formed for example using LPCVD. Other charge trapping materials and structures may be employed, including for example high nitrogen silicon oxynitride ($Si_xO_yN_z$), silicon-rich nitride, silicon-rich oxide, trapping layers including embedded nanoparticles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer 17 in this embodiment comprises silicon dioxide having a thickness of 5 nm or more, which can be formed by chemical vapor deposition CVD or atomic layer deposition ALD, or by thermal conversion from the silicon nitride charge trapping layer 16. Alternative blocking dielectric layer materials or combinations of material are also possible.

In a representative embodiment, the first layer 13 can be 1.3 nm of silicon dioxide; the band offset layer 14 can be 2 nm of silicon nitride; the isolation layer 15 can be 3.5 nm of SiON with an index of refraction of about 1.63; the charge trapping layer 16 can be 6 nm of silicon nitride; and the blocking dielectric layer 17 can be 6 nm of silicon oxide. The gate material can be p+ polysilicon (work function about 5.1 eV).

The gate 18 comprises a material selected to provide sufficient electron barrier height for the blocking dielectric layer. Materials that may be used for the gate 18 include N+ poly silicon, Al, P+ poly silicon, Ti, TiN, Ta, TaN, Ru, Pt, Ir, $RuO_2$, $IrO_2$, W, WN, and others.

Electric field dynamics during an erase process result in an electric field across the charge trapping structure (layers 13-17) induced by bias voltages $V_G$ and $V_W$ applied at the gate and channel of the memory cell, and result in an electric field $E_{TUN}$ tending to induce hole tunneling through the layers 13-15 of the dielectric tunneling structure, and an electric field $E_B$ tending to induce electron tunneling through the blocking layer 17. The magnitude of the electric field $E_{TUN}$ through the dielectric tunneling layer is sufficient to induce hole tunneling current 52 into the trapping layer 16. The magnitude of the electric field $E_B$ through the blocking dielectric layer 17 is low enough that electron tunneling is effectively blocked, allowing large memory windows without erase saturation effects. Memory devices as taught herein are operable with bias voltages across the gate and semiconductor body low enough that a maximum average electric field of 14 MV/cm or less occurs across the charge trapping structure (layers 13-17) during erase, with a corresponding lower electric field in the blocking dielectric layer.

Figure 2:
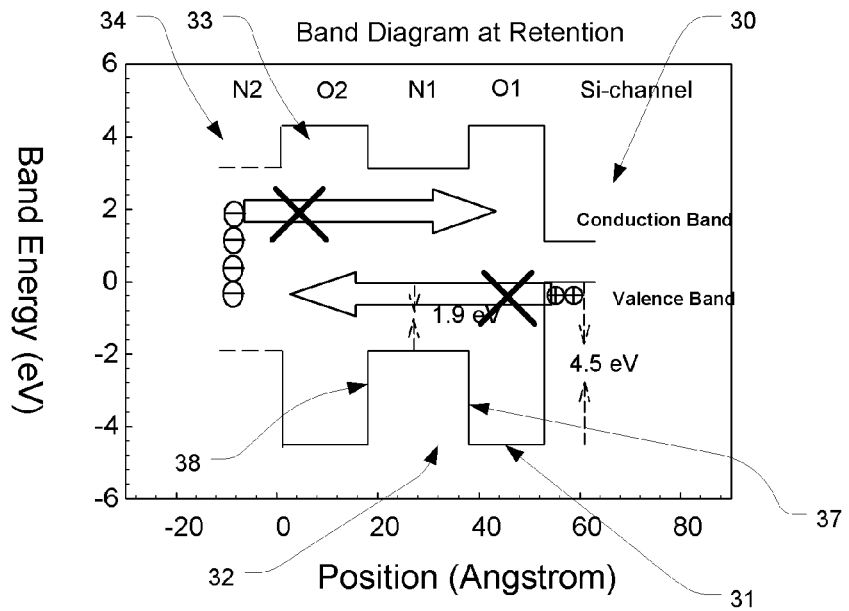
FIG. 2 is a band diagram for a prior art tunneling dielectric structure including band offset technology at a low electric fields.

FIG. 2 is a diagram of the energy levels of the conduction and valence bands of the dielectric tunneling structure the including the stack of layers 13-15 for a prior art BE-SONOS device under a low electric field, showing a "U-shaped" conduction band and an "inverted U-shaped" valence band. From the right side, the band gap for the semiconductor body is shown in region 30, the valence and conduction bands for the hole tunneling layer are shown in region 31, the band gap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer 34, and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, in the valence band in all three layers 31, 32, 33 the tunneling dielectric structure remains significantly below the valence band in the channel region 30. The tunneling layer described herein therefore is characterized by band offset characteristics, include a relatively large hole tunneling barrier height in a thin region (layer 31) at the interface with the semiconductor body, and an increase 37 in valence band energy level at a first offset less than 2 nm from the channel surface. The band offset characteristics also include a decrease 38 in valence band energy level at a second offset from the channel by providing a thin layer 33 of relatively high tunneling barrier height material, resulting in the inverted U-shaped valence band shape. Likewise, the conduction band has a U-shape caused by the same selection of materials.

Figure 3:
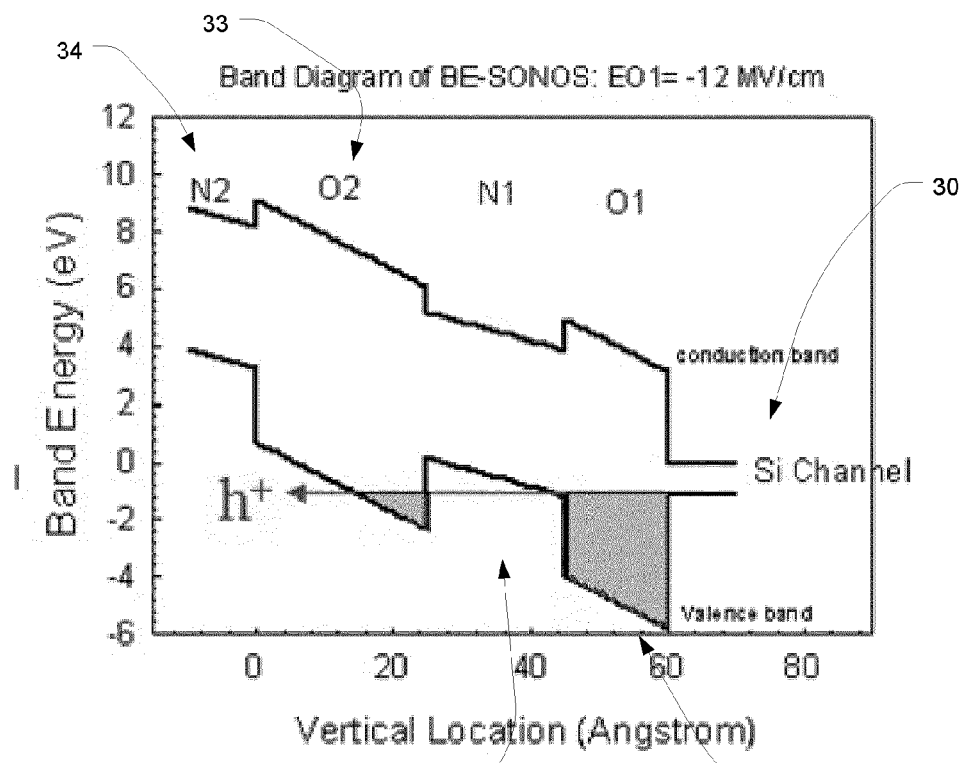
FIG. 3 is a band diagram for a prior art tunneling dielectric structure including band offset technology at high electric fields.

FIG. 3 shows the band diagram for the dielectric tunneling structure under conditions of an electric field of about −12 MV/cm in the tunneling layer 31, for the purposes of inducing hole tunneling (in FIG. 3, the O1 layer is about 1.5 nm thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 3) between the level of the valence band in the channel, and the above sloped, inverted U-shaped valence band, in the tunneling stack is reduced. The band offset effectively eliminates the blocking function of the offset layer in region 32 and the isolation layer in region 33 from the tunneling dielectric during high electric field allowing a large hole tunneling current under relatively small electric fields (e.g. E<14 MV/cm).

The isolation layer 33 isolates the offset layer 32 from a charge trapping layer 34. This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 3 nm thick, and more preferably about 2.5 nm or less.

The hole tunneling layer 31, for an embodiment employing silicon dioxide, should be less than 2 nm thick, and more preferably less than 1.5 nm thick. For example, in a preferred embodiment, the hole tunneling layer 31 is silicon dioxide about 1.3 nm thick, and exposed to a nitridation process as mentioned above resulting in an ultrathin silicon oxynitride.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using band gap engineering.

Figure 4:
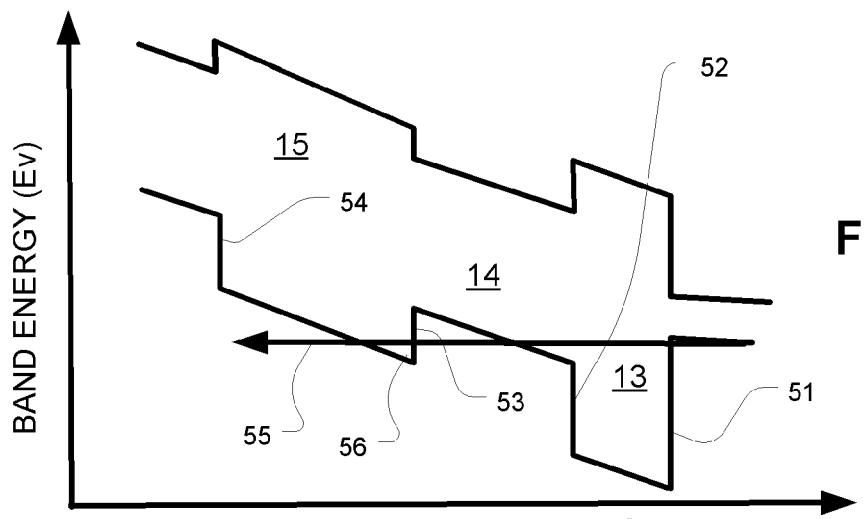
FIGS. 4-6 are band diagrams for tunneling dielectric structures useful in understanding the use of SiON isolation layers in band offset technology.
Figure 5:
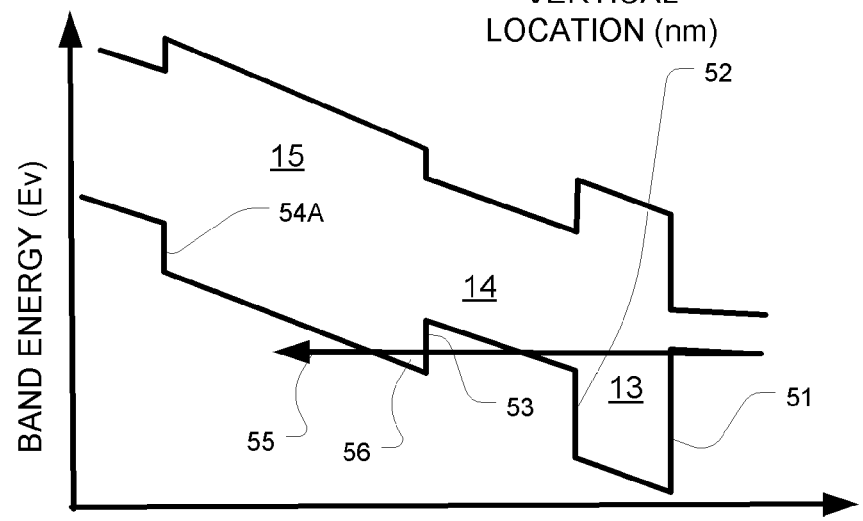
Figure 6:
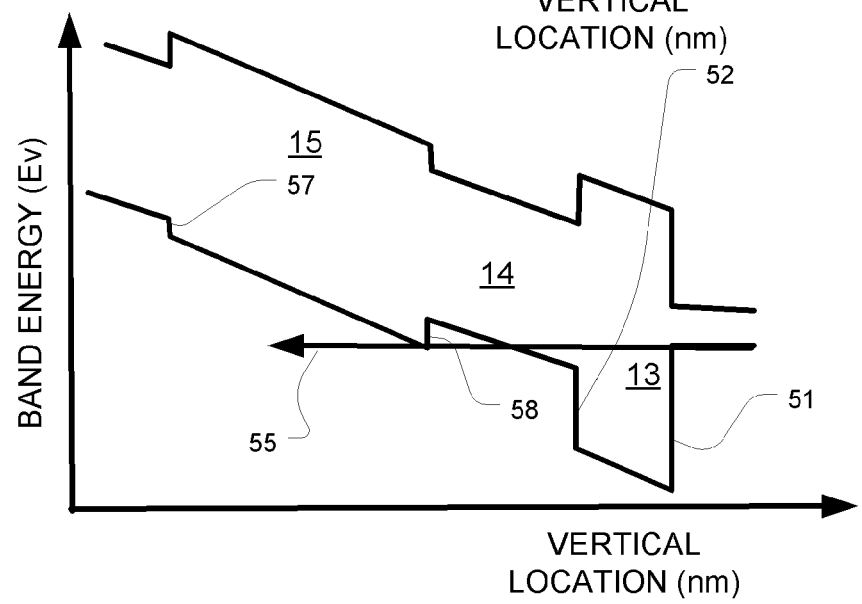

FIGS. 4, 5 and 6 are drawings based on calculated band diagrams for three example implementations of the tunneling dielectric structures where the first layer 13 (using the same reference numerals as FIG. 1) on the channel consists of 1.3 nanometers of silicon dioxide, a second layer 14 consists of 2 nanometers of silicon nitride and the third layer 15 is different for each example. Referring to FIG. 4, the bandgap for the channel and the silicon substrate is on the left side of the plot. A transition 51 shows the hole tunneling barrier established by the silicon dioxide first layer 13. A transition 52 shows the reduction in magnitude of the band offset at the interface between the silicon dioxide first layer 13 and a silicon nitride the second layer 14. A transition 53 shows the increasing magnitude of the band offset at the interface between the silicon nitride second layer 14 and a silicon dioxide third layer 15. A transition 54 shows the reduction in magnitude of the band offset at the interface between a silicon dioxide third layer 15 and the charge trapping layer comprising silicon nitride. In the embodiment represented by FIG. 4, the silicon dioxide third layer 15 is about 2.5 nanometers thick, and so the distance between transitions 53 and 54 is about 2.5 nanometers.

The bands are sloped under the bias of an average electric field of about 10 MV/cm in this example. The average electric field can be determined by dividing the voltage across the data storage structure by the effective oxide thicknesses EOT of the layers, where the EOT of a layer is equal to its measured thickness times the ratio of its dielectric constant and the dielectric constant of silicon dioxide. The area beneath the valence band energy level of the substrate represented by arrow 55 and above the valence band of the tunneling dielectric structure represents a tunneling probability at this electric field.

FIG. 5 illustrates the similar structure except that the thickness of the silicon dioxide third layer 15 is increased to about 3.5 nanometers so that the transition 54A is moved further from transition 53. It can be seen that the area beneath the valence band energy level represented by arrow 55 and above the valence band of the tunneling dielectric structure is the same as that for the structure of FIG. 4. Thus, it is apparent that simply increasing the thickness of the isolation layer 15 does not improve erase performance.

FIG. 6 illustrates a structure according to the present invention, where the third layer 15 is implemented using a 3.5 nanometers thick layer of SiON lowering the barrier height of the transition 53 of about 3.5 eV which occurs using silicon dioxide as the third layer 15, by about 1 eV to implement a transition 58 of about 2.5 eV. Also the transition 57 between the SiON layer 15 and the silicon nitride charge trapping layer is also reduced. Thus, the electric field creates an upward slope in the valence band energy level, raising the valence band energy level after the offset at transition 52 and in addition at the transition 58 to a level that effectively eliminates the hole tunneling barrier in the engineered tunneling dielectric after the offset at lower electric field magnitudes than possible using the prior art BE-SONOS devices. This eliminates contribution to the probability of hole tunneling which occurs under an average electric field of about 10 MV/cm due to the area 56 shown in FIGS. 4 and 5 beneath line 55 within the third layer 15. It can be seen that the magnitude of the valence band offset (and therefore the concentration of nitrogen) at the transition 58 needed to accomplish this result depends on the combined thicknesses of the tunneling layer 13 and the offset layer 14, as well as on the magnitude of the electric field.

Figure 7:
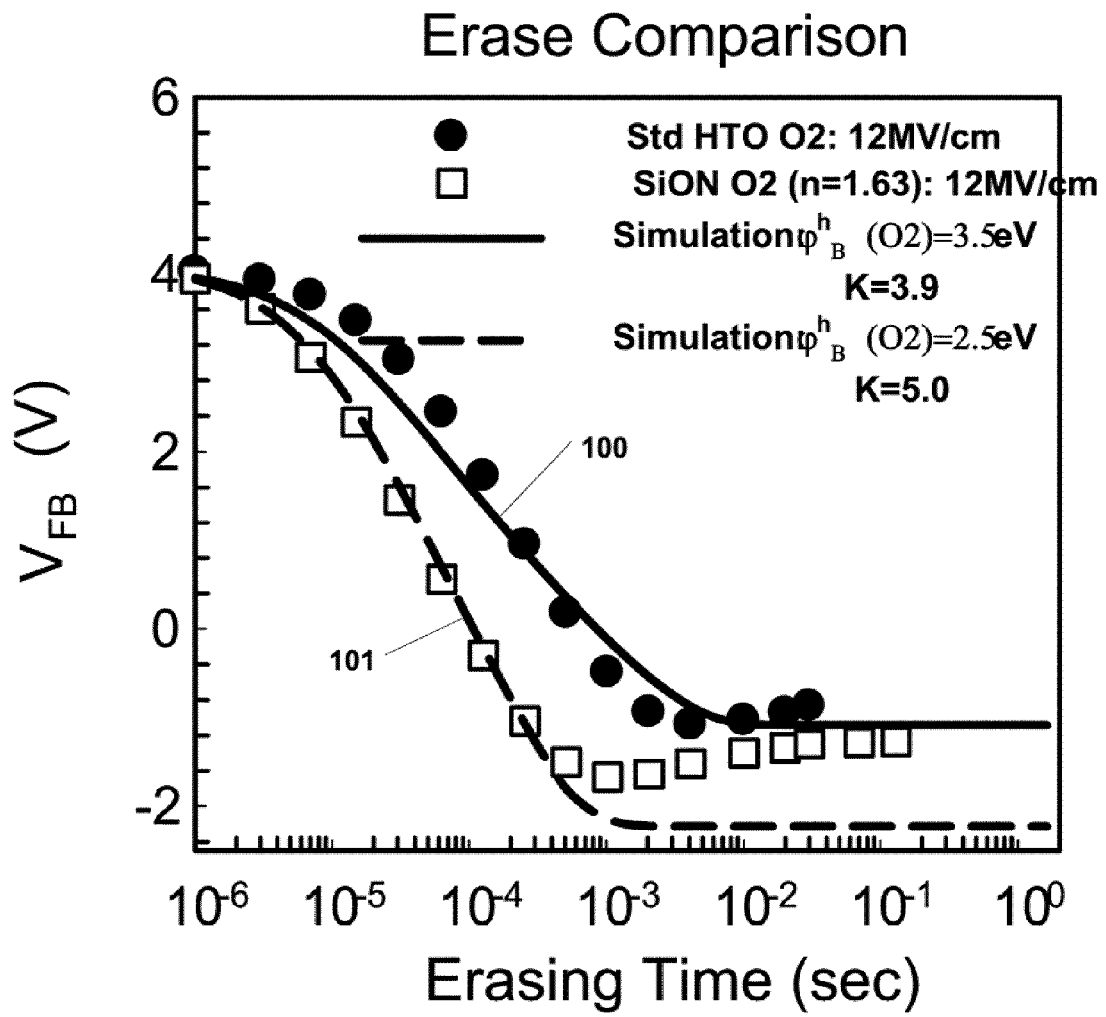
FIG. 7 is a plot of flat band voltage versus erasing time comparing performance of standard BE-SONOS cell with the performance of a cell having an SiON isolation layer.

FIG. 7 plots flat band voltage VFB versus erasing time for a structure having a band diagram like that in FIGS. 5 and 6, with a third layer 15 that is 3.5 nanometers thick. Trace 100 shows the simulated erase time under an average electric field of 12 MV/cm for the silicon dioxide third layer 15, and the filled circles show measured results matching the simulation relatively well. Trace 101 shows simulated erase time for the SiON third layer 15 (named "O2" in the Figure), having a concentration of nitrogen so that the index of refraction is about 1.63. The open boxes show measured results that match the simulation relatively well. The dielectric constant K is also shown in the drawing. This graph illustrates that the erasing time represented by the time required for the threshold to drop about 4 volts is reduced by about an order of magnitude (10 times) using the technology described here. Erase times smaller than one millisecond are achieved using a SiON third layer 15 as described herein.

A variety of embodiments have been tested as shown in the following table, in which the first row is the standard BE-SONOS implementation using a silicon dioxide third layer 15. Other examples use SiON third layer 15 with a thickness of either 2.5 nanometers or 3.5 nanometers. An additional example was tested in which the SiON third layer 15 was at an index of refraction n=1.58. However, the performance of that example was similar to that of n=1.63 for program/erase and for ISPP programming performance and is not included here.

|  | O1/N1/O2 (or SiON)/N2/O3 (BE-SONOS film stack) |
| --- | --- |
| STD | 13/20/25/60/60 |
| SiON 1 | 13/20/25(n = 1.63)/60/60 |
| SiON 2 | 13/20/25(n = 1.72)/60/60 |
| SiON 3 | 13/20/35(n = 1.50)/60/60 |
| SiON 4 | 13/20/35(n = 1.63)/60/60 |
| SiON 5 | 13/20/35(n = 1.72)/60/60 |

FIGS. 8 through 11 show the program and erase characteristics as represented by flat band voltage versus programming or erasing time for the examples studied. Flat band voltage correlates with threshold voltage in operating memory cells, and so these plots showing changes in flat band voltage are an accurate indication of changes in threshold voltage, and therefore reflect program and erase times for the memory cells.

Figure 8:
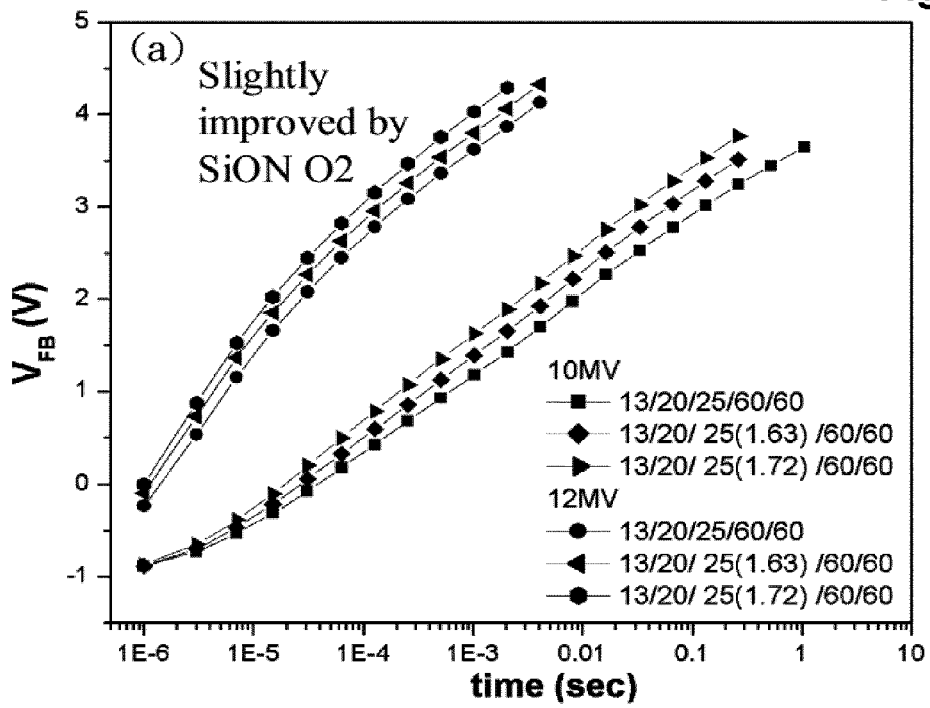
FIG. 8 is a plot of flat band voltage versus programming time for examples discussed herein having an isolation layer 2.5 nanometers thick, with various concentrations of nitrogen.
Figure 9:
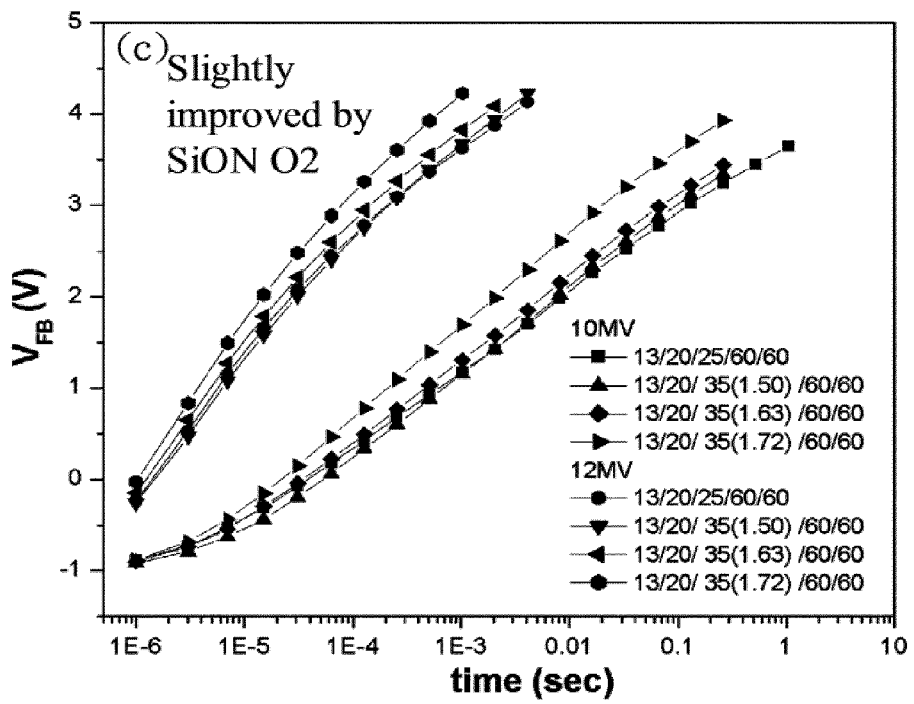
FIG. 9 is a plot of flat band voltage versus programming time for examples discussed herein having an isolation layer 3.5 nanometers thick, with various concentrations of nitrogen.

In FIG. 8, program times under an electric field of 10 MV/cm and an electric field of 12 MV/cm are plotted for the STD, SiON 1 and SiON 2 examples. Under both electric field conditions, increasing the concentration of nitrogen from essentially zero in the STD example to levels in which the index of refraction is 1.63, and then 1.72 results in slightly improving program times. In FIG. 9, program times under an electric field of 10 MV/cm and an electric field of 12 MV/cm are plotted for the STD, SiON 3, SiON 4 and SiON 5 examples. Under both electric field conditions, increasing the concentration of nitrogen from essentially zero in the STD example to levels in which the index of refraction is 1.50, 1.63, and then 1.72 results in slightly improving program times. Also, the plots in FIG. 8 and FIG. 9 show that the program speed is essentially the same with increasing thickness of third layer 15, from the 2.5 nanometer (FIG. 8) to the 3.5 nanometer (FIG. 9) thicknesses. These results show that programming speed is not adversely impacted by changing from silicon dioxide to SiON in the third layer 15. Also, programming speeds can be increased with increasing concentration of nitrogen in the SiON third layer 15.

Figure 10:
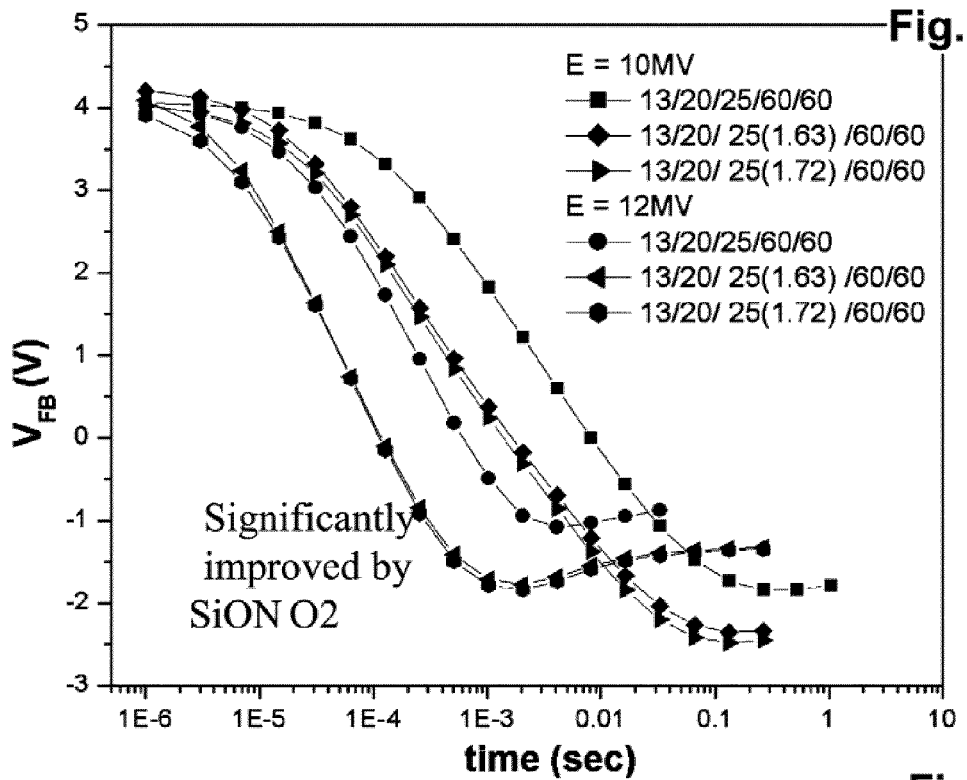
FIG. 10 is a plot of flat band voltage versus erasing time for examples discussed herein having an isolation layer 2.5 nanometers thick, with various concentrations of nitrogen.

In FIG. 10, erase time under an electric field of 10 MV/cm (opposite polarity relative to the programming field) and an electric field of 12 MV/cm is plotted for the STD, SiON 1 and SiON 2 examples. Under both electric field conditions, increasing the concentration of nitrogen from essentially zero in the STD example to levels in which the index of refraction is 1.63, and then 1.72, results in significantly improving erase times. It is noted also that the erase times for the examples SiON 4 (n=1.63) and SiON 5 (n=1.72) are very similar in both electric field conditions.

Figure 11:
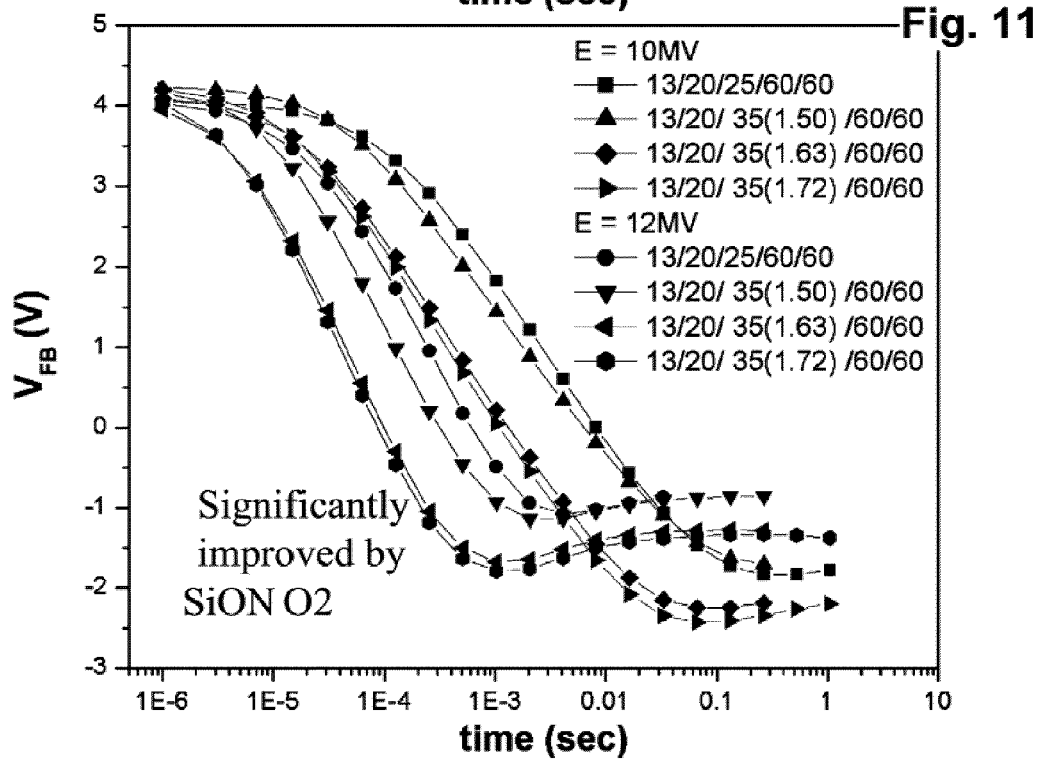
FIG. 11 is a plot of flat band voltage versus erasing time for examples discussed herein having an isolation layer 3.5 nanometers thick, with various concentrations of nitrogen.

FIG. 11 shows erase time under an electric field of 10 MV/cm and an electric field of 12 MV/cm for the STD, SiON 3, SiON 4 and SiON 5 examples. Under both electric field conditions, increasing the concentration of nitrogen from essentially zero in the STD example to levels in which the index of refraction is 1.50, 1.63, and then 1.72 results in improving erase times by an order of magnitude. Also, the plots shows that the erase speed remained essentially the same in both the 2.5 nanometer (FIG. 10) and 3.5 nanometer (FIG. 11) thicknesses for third layer 15.

Figure 12:
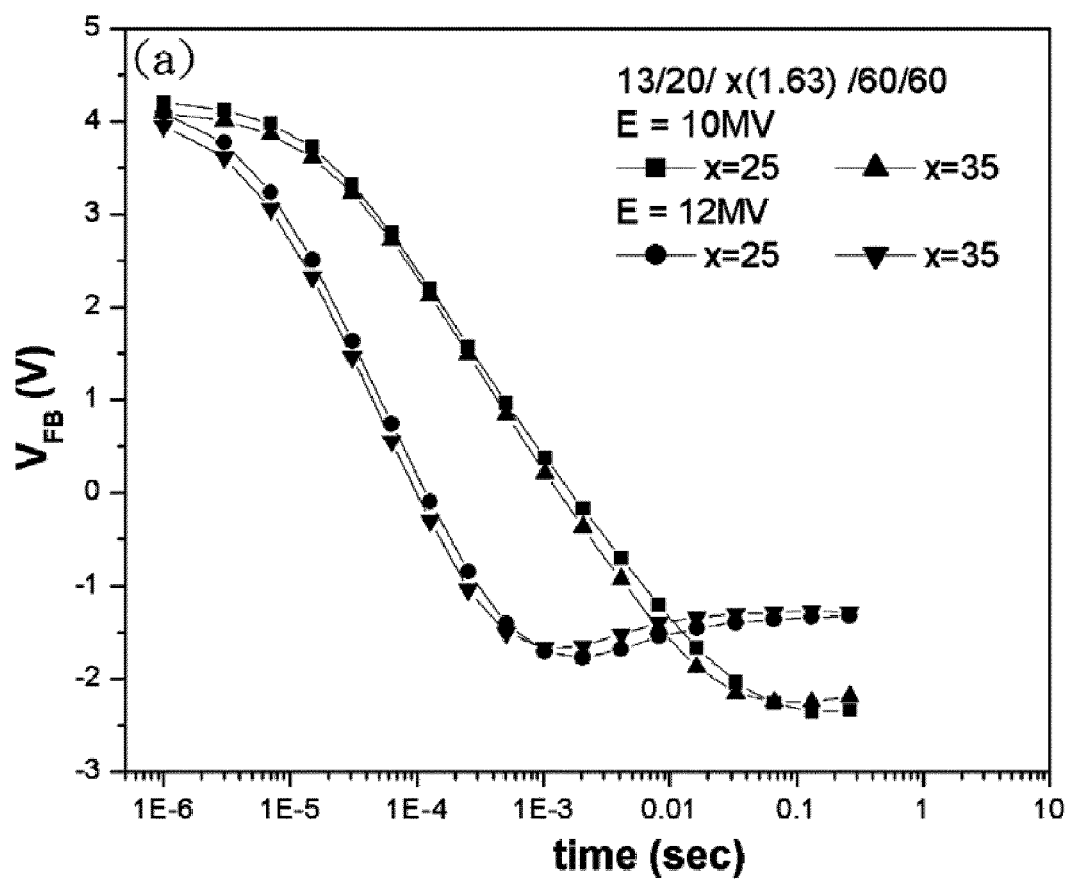
FIG. 12 is a plot of flat band voltage versus erasing time for a first example with an SiON isolation layer 2.5 nanometers thick and a second example with an SiON isolation layer 3.5 nanometers thick, having the same concentration of nitrogen, and under two bias conditions.
Figure 13:
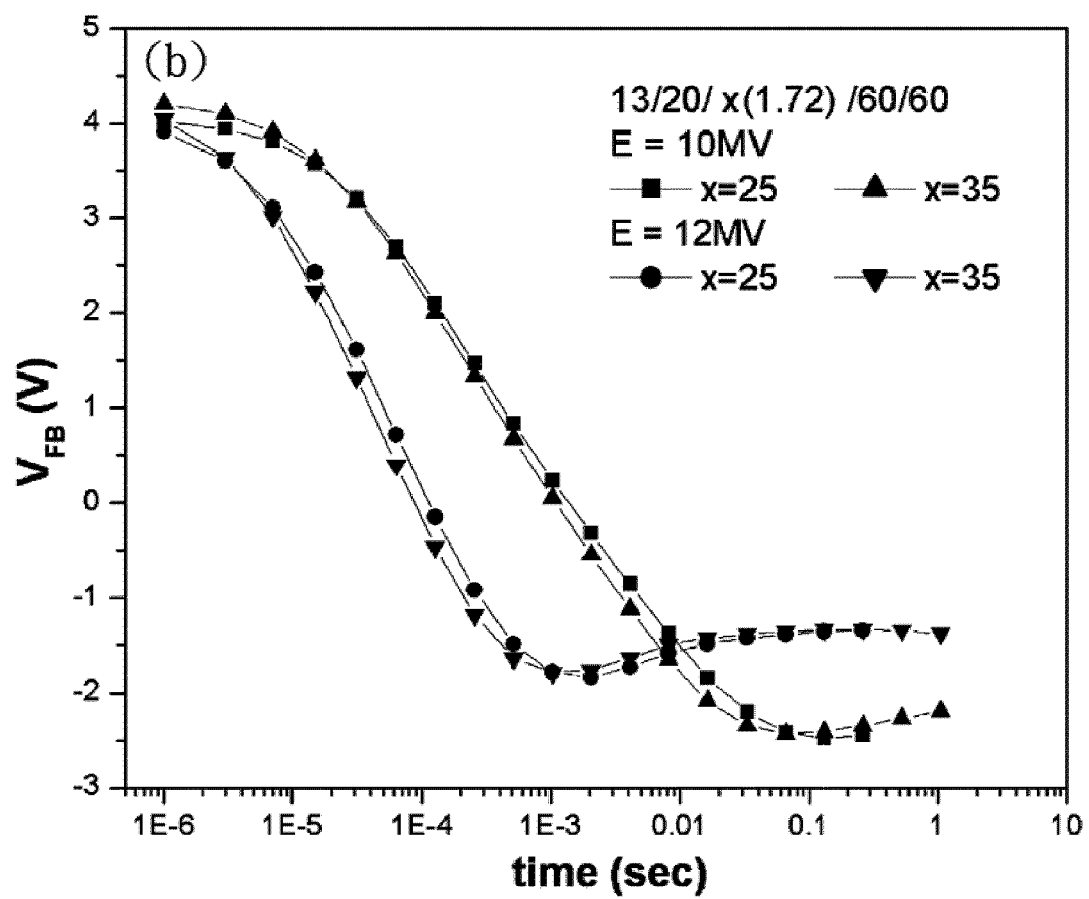
FIG. 13 is a plot like FIG. 12, of flat band voltage versus erasing time for a first example with an SiON isolation layer 2.5 nanometers thick and a second example with an SiON isolation layer 3.5 nanometers thick under two bias conditions, having a greater concentration of nitrogen than in FIG. 12.

FIGS. 12 and 13 show measured erase performance data in flat band voltage versus erase time, for examples SiON 1 versus SiON 4 (n=1.63), and SiON 2 versus SiON 5 (n=1.72), respectively, in which the examples differ in changing thickness of the SiON third layer 15 from 2.5 to 3.5 nanometers. These plots illustrate that increasing the thickness of the SiON layer 15 to 3.5 nm does not have a significant impact on erase times.

Figure 14:
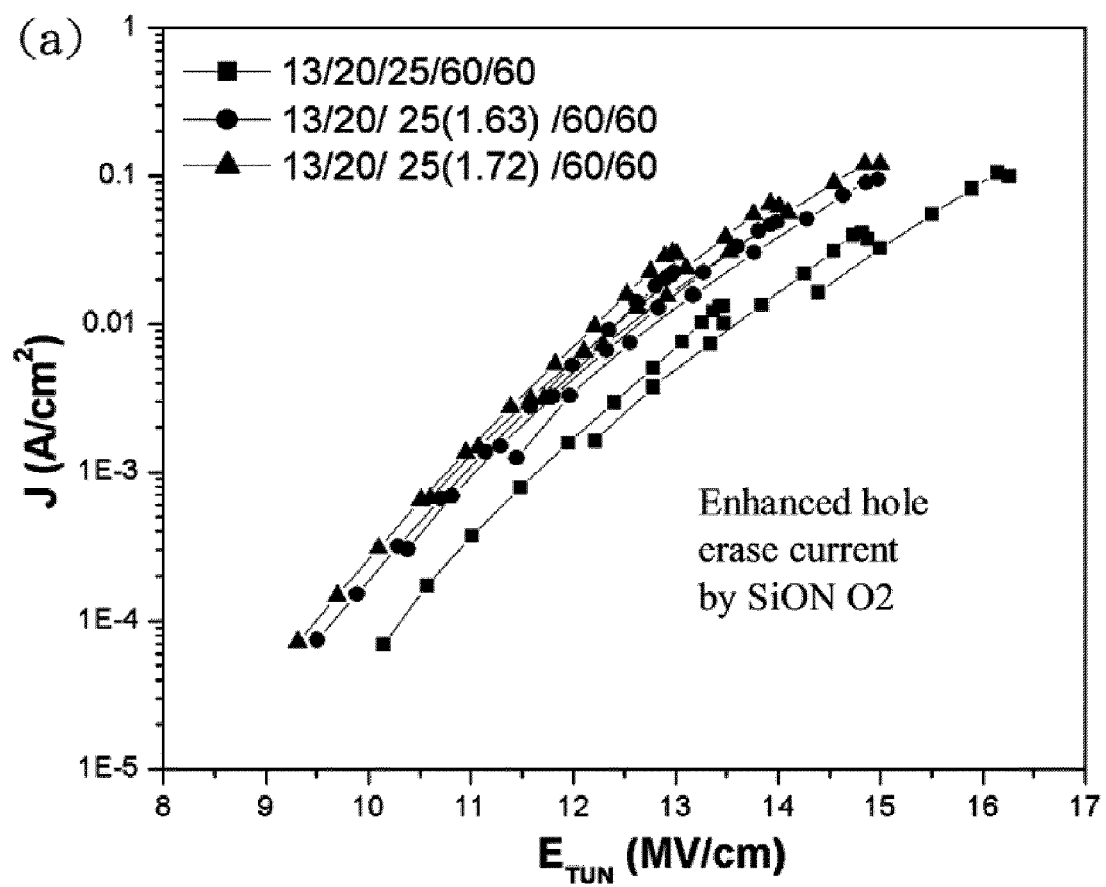
FIG. 14 is a plot of hole tunneling current density versus electric field magnitude for examples discussed herein having an isolation layer 2.5 nanometers thick, with various concentrations of nitrogen.
Figure 15:
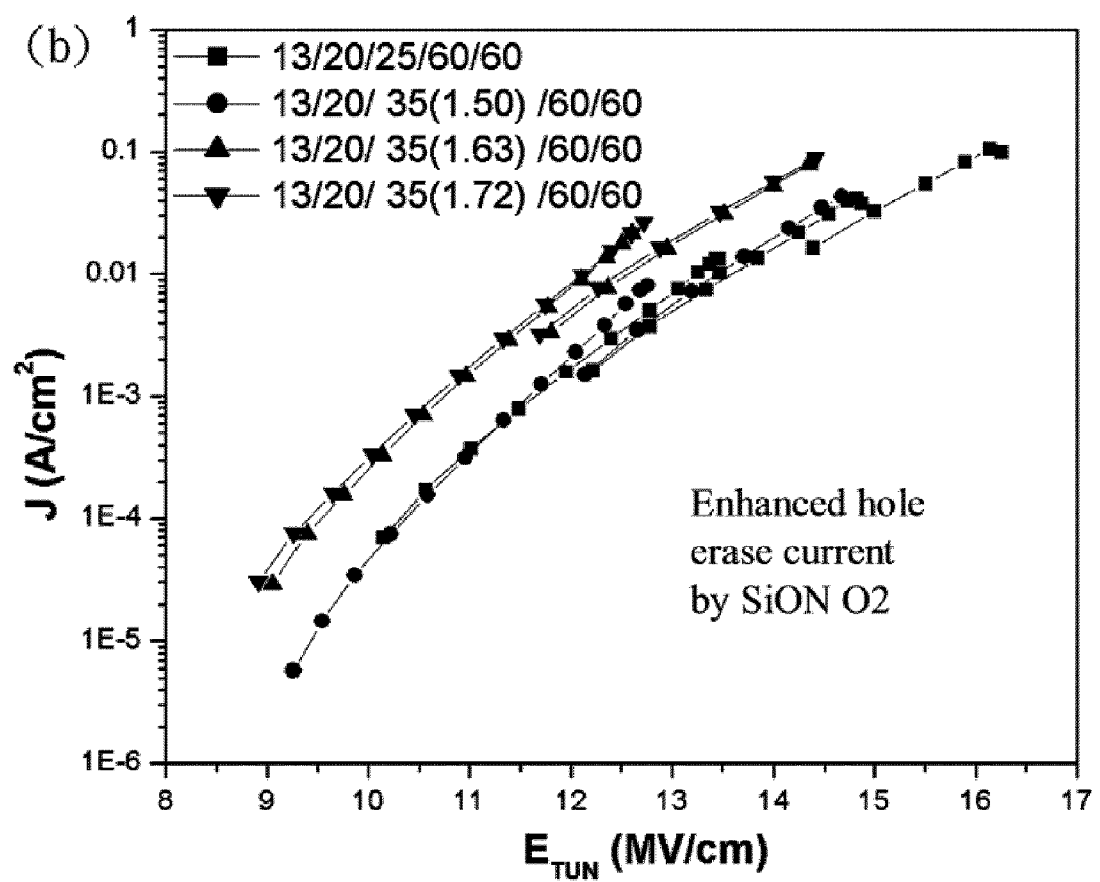
FIG. 15 is a plot of hole tunneling current density versus electric field magnitude for examples discussed herein having an isolation layer 3.5 nanometers thick, with various concentrations of nitrogen.

FIGS. 14 and 15 show measured erase performance data as reflected by hole current density versus electric field using transient analysis (See, Lue et al., "A transient analysis method to characterize the trap vertical location in nitride trapping devices", IEEE Electron Device Letters, Vol. 25, pp. 816-818, 2004), for the examples SiON 1 and SiON 2 (2.5 nanometers thick, n=1.63 and n=1.72), and SiON 3, SiON 4 and SiON 5 (3.5 nanometers thick, n=1.5, 1.63 and 1.72). These plots illustrate that increasing the concentration of nitrogen in the SiON layer 15 enhances erasing current at a given electric field magnitude, as predicted by the discussion above of FIGS. 4-6. Also, the traces for n=1.63 and n=1.72 are similar, suggesting that the effect saturates at the concentration corresponding with the index of refraction 1.63 for the tested structure.

Figure 16:
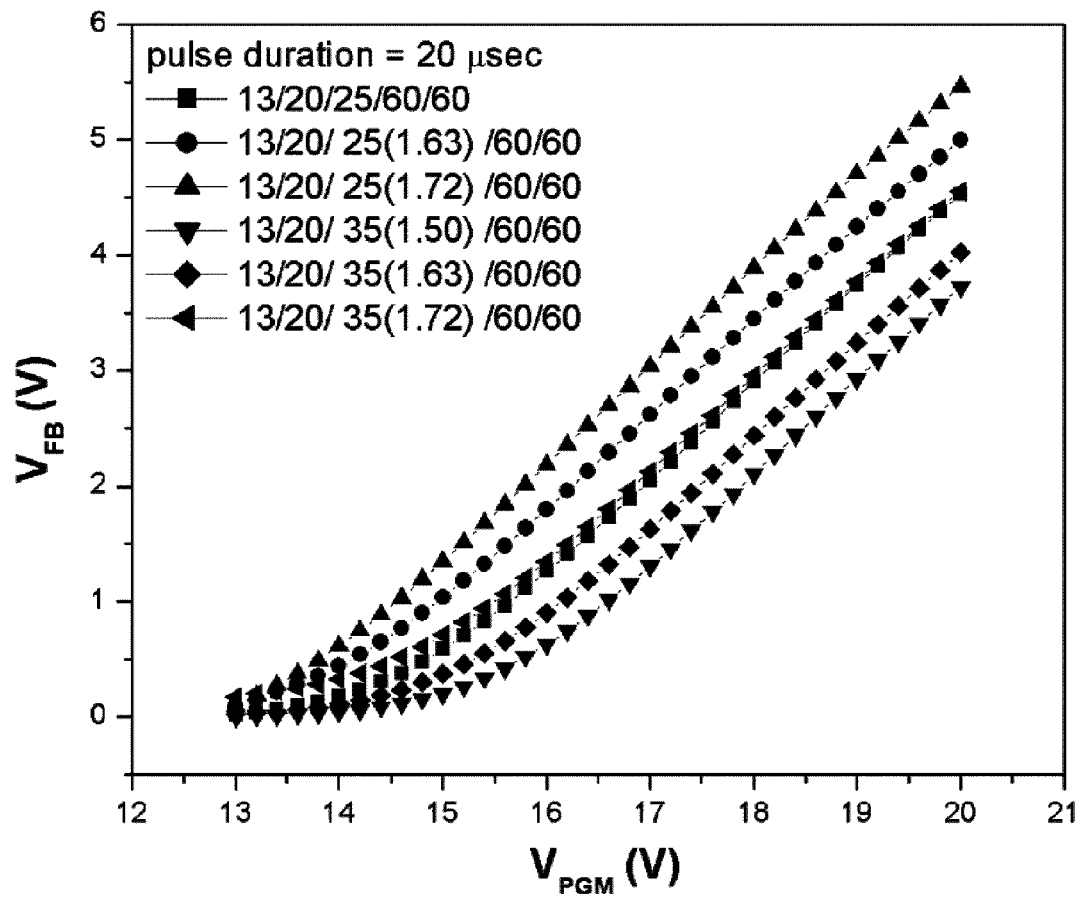
FIG. 16 shows incremental step pulse programming ISPP performance for the examples discussed herein.

FIG. 16 shows the incremental stepped pulse programming ISPP programming performance in flat band voltage versus programming voltage having a constant pulse duration of about 20 microseconds for the six examples STD, SiON 1, SiON 2, SiON 3, SiON 4 and SiON 5. As can be seen, the ISPP slopes are close to 0.9 in each example, illustrating that ISPP performance can be maintained or improved using the technology described herein.

Figure 17:
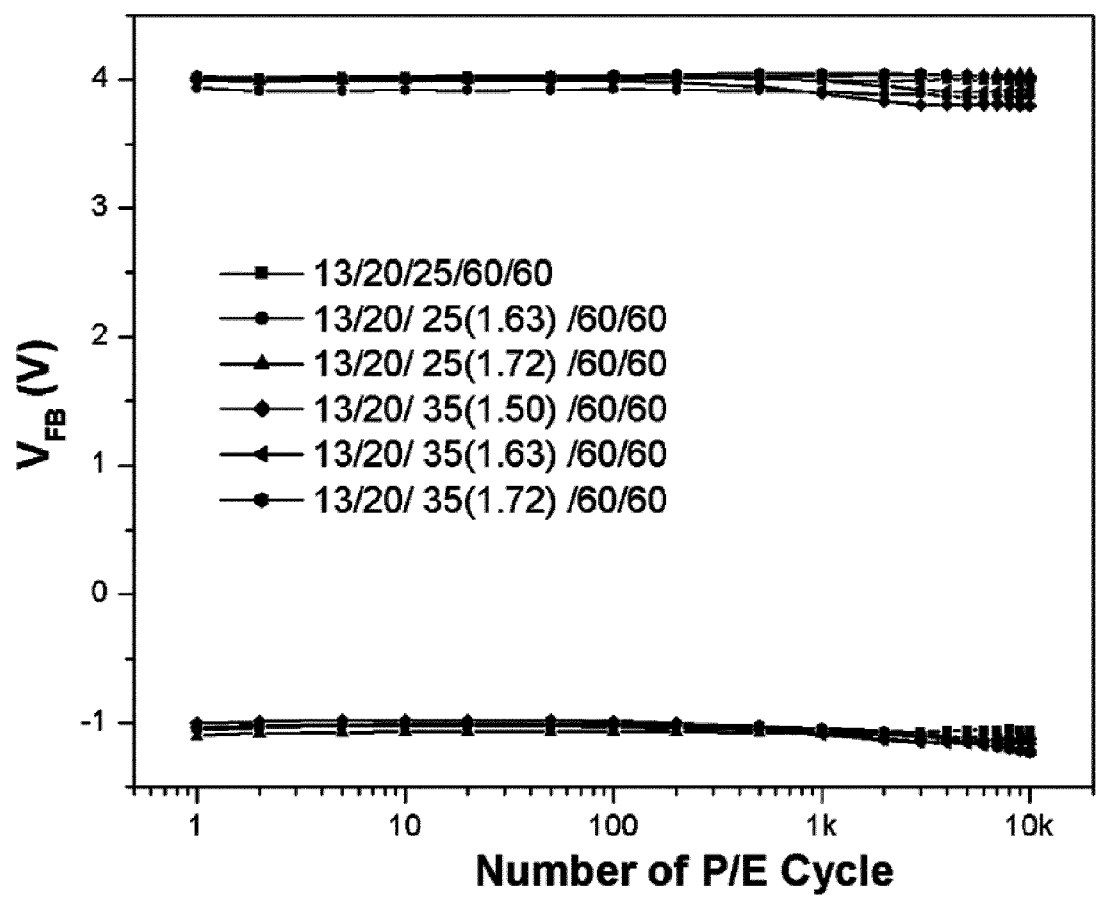
FIG. 17 is a plot of program/erase cycling endurance for the examples discussed herein.

FIG. 17 shows the flat band voltage versus the number of program/erase cycles for the six examples STD, SiON 1, SiON 2, SiON 3, SiON 4 and SiON 5. This illustrates that there is no obvious program/erase cycling endurance degradation due to the introduction of SiON as the third layer 15.

Figure 18:
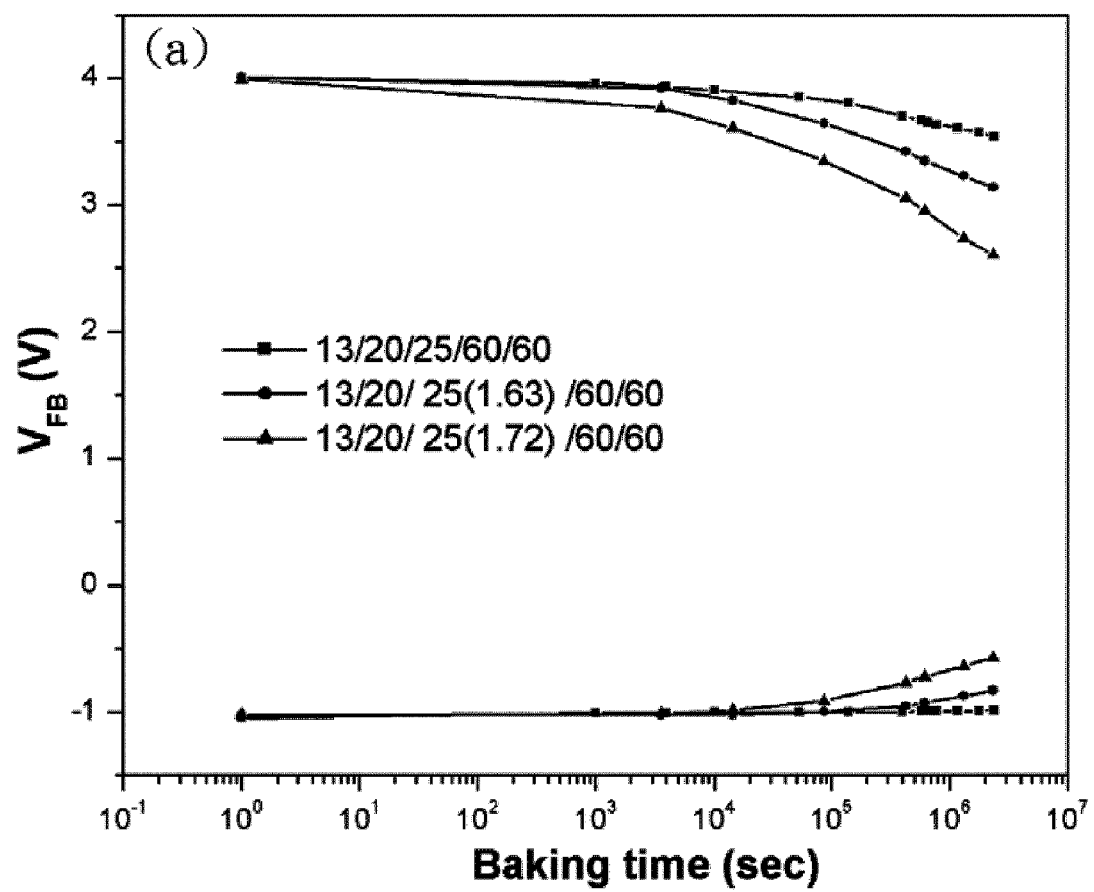
FIG. 18 is a plot of data retention performance for the examples discussed herein having an isolation layer 2.5 nanometers thick, with various concentrations of nitrogen.
Figure 19:
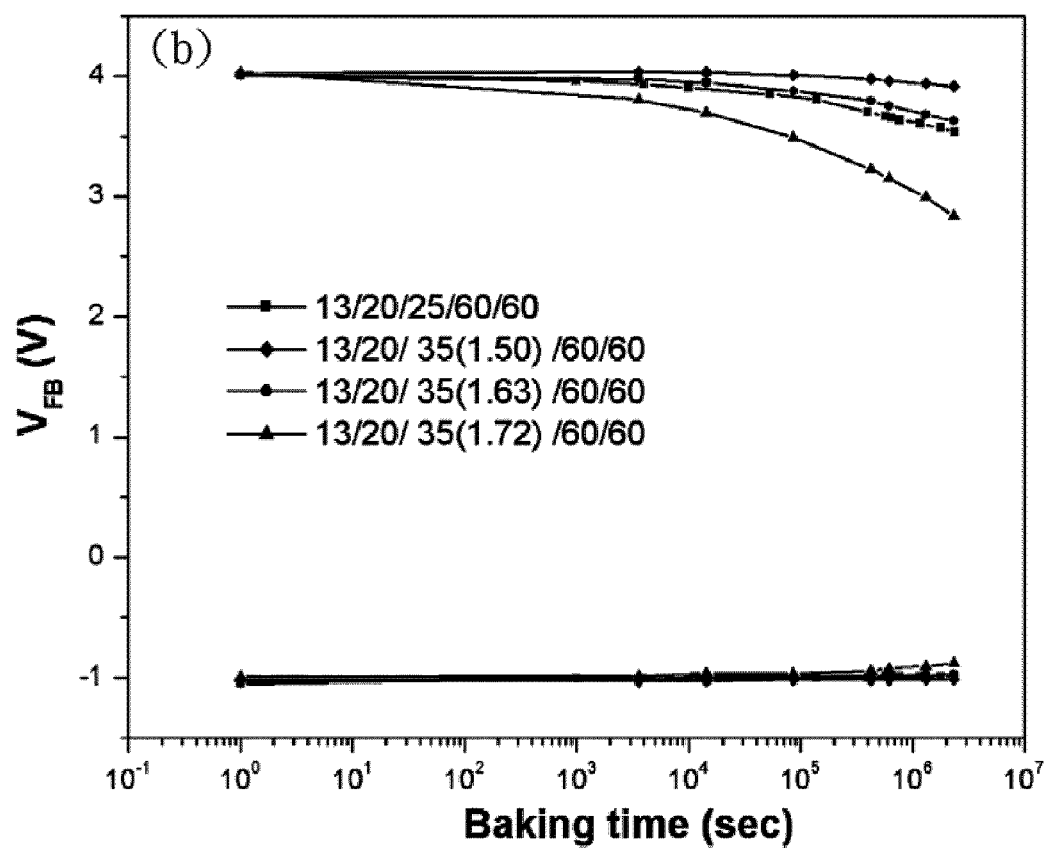
FIG. 19 is a plot of data retention performance for the examples discussed herein having an isolation layer 3.5 nanometers thick, with various concentrations of nitrogen.

FIGS. 18 and 19 illustrate data retention under 150° C. bake testing. In FIG. 18, the STD, SiON 1 and SiON 2 examples are plotted. For the relatively high concentration of nitrogen, such as the embodiment SiON 2 with n=1.72, some degradation in data retention is observed. However, for lower concentrations of nitrogen, data retention is not substantially reduced. In FIG. 19, showing results for the STD, SiON 3, SiON 4 and SiON 5 examples, improved retention is observed relative to the SiON 1 and SiON 2 examples. Thus increasing the thickness of third layer 15, and changing its composition to SiON can maintain data retention performance, while improving erase performance.

FIG. 19 shows that data retention for the examples SiON 3 and SiON 4 is improved relative to that of the STD example, showing a surprising result that erase speed is improved, retention is improved and endurance is not impacted by the technology described here, when the concentration of nitrogen in the SiON third layer is below a critical threshold less than n=1.72, and for the structure described about below a critical threshold at or below about n=1.63, where the use of the term "about" reflects the measurement uncertainties inherent in these tests.

This data shows a critical threshold for the thickness of the SiON third layer greater than 2.5 nanometers. For a concentration of nitrogen reflected by n=1.63, the critical thickness for maintaining or improving retention is between about 3 nanometers and 4 nanometers, and close to 3.5 nm in this example.

It is believed that the upper limit on thickness of the third SiON layer with an index of refraction between about 1.50 and 1.63 is about 4 nm, as the magnitude of the electric field across the charge storage structure is a function of the EOT, increasing the physical thickness of third layer 15 can reduce the electric field magnitude in the tunneling layer 13, with consequent reductions in hole tunneling current, or can require consequent increases in operating voltages to maintain the same electric field or hole tunneling current magnitudes.

Figure 20:
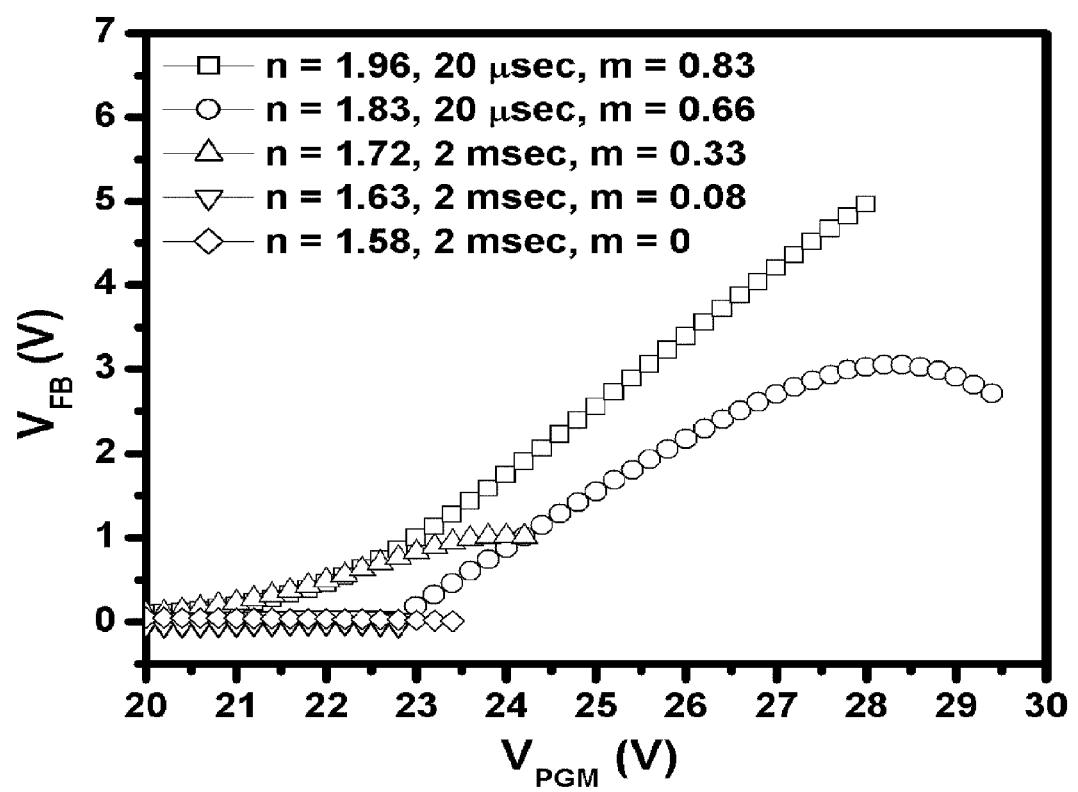
FIG. 20 plots the results of testing charge trapping efficiency by applying ISPP programming operations to test structures having SiON charge trapping layers with various concentrations of nitrogen.

FIG. 20 is a plot showing charge trapping efficiency as reflected by ISPP programming performance, for various concentrations of nitrogen in a layer of SiON, demonstrating yet another design tradeoff for the use of SiON in dielectric tunneling structures. The plot illustrates testing of a structure having a 7 nanometers layer of silicon dioxide as a tunneling layer, and a 7 nanometers layer of SiON with varying concentrations of nitrogen as a charge trapping layer, and a 9 nanometers layer of silicon dioxide as a blocking layer. As shown, wherein the index of refraction of the charge trapping layer is about 1.63 or lower, the ISPP slope (m) falls from 0.08 to zero indicating that the SiON at relatively low concentrations of nitrogen has very few charge trapping sites and can have negligible impact on charge trapping in a tunneling dielectric structure as discussed above. When the index of refraction is about 1.72, the ISPP slope increases to about 0.33. Thus, for a thin layer of SiON used as third layer 15 in a dielectric charge trapping structure, a critical threshold of concentration of nitrogen is believed to be at some point below about the concentration reflected by an index of refraction of about 1.72, and preferred embodiments have a concentration of nitrogen reflected by an index of refraction of about 1.63 or lower in order to be assured that the tunneling dielectric structure as a whole does not trap charge, or traps only a negligible amount of charge. This supports the data shown in FIG. 19 that a critical threshold for the index of refraction of the SiON lies at a level less than 1.72, and for the embodiments described herein at a level less than or equal to about 1.63.

Figure 21:
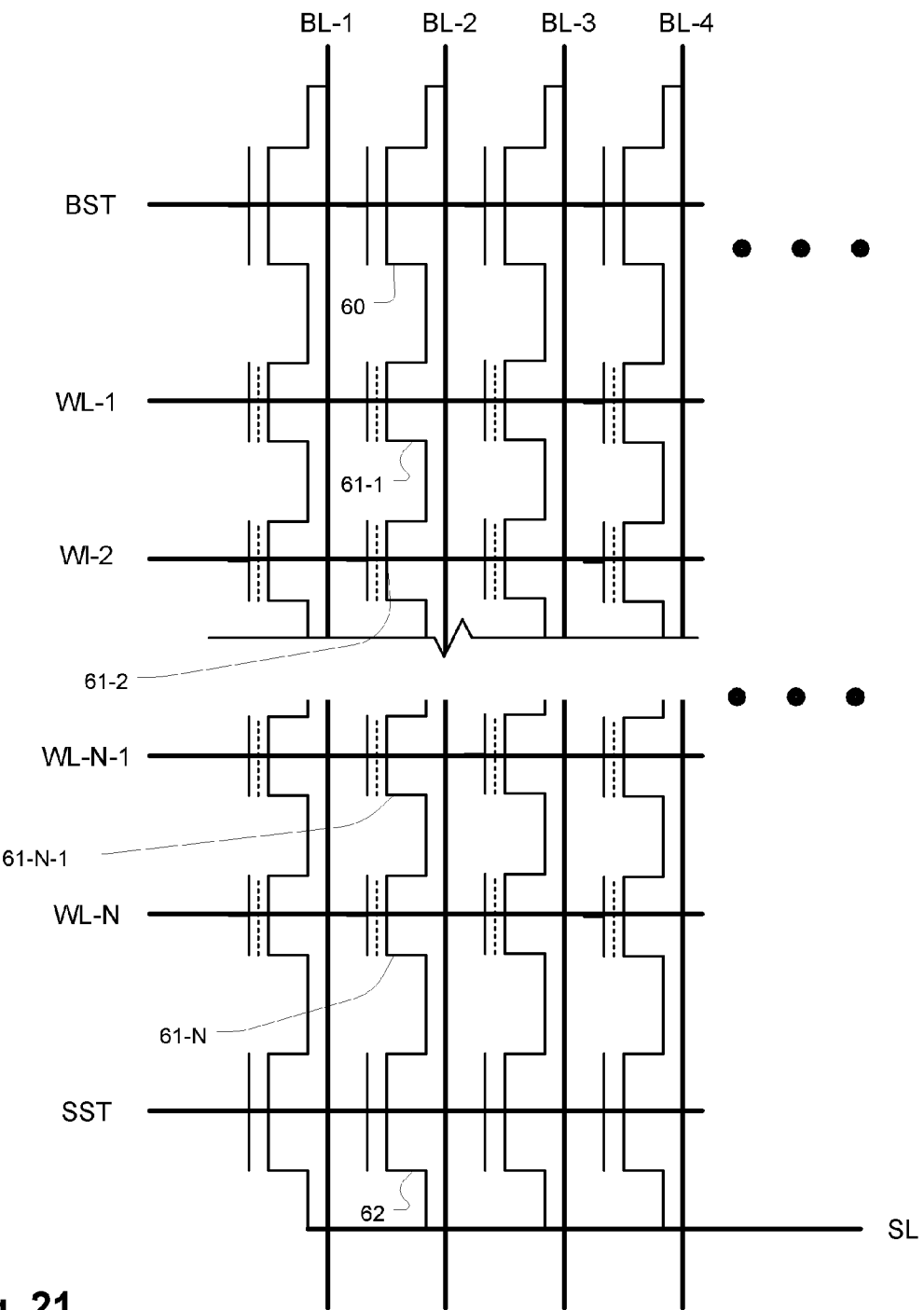
FIG. 21 is a schematic diagram of a NAND-type memory array employing memory cells according to the present invention.

Memory cells implemented as described above can be arranged in a NAND-type array as shown in FIG. 21. The array includes a plurality of bit lines BL-1, BL-2, BL-3, BL-4, ..., and a plurality of word lines WL-1, WL-2, ..., WL-N-1, WL-N. Groups of N memory cells are connected in series between a block select transistor coupled to a corresponding bit line and a source select transistor coupled to a source line. A block select word line BST is coupled to a row of block select transistors and a source select word line SST is coupled to a row of source line connect transistors. Thus, for example, for a representative bit line, BL-2, in the figure, a block select transistor 60 connects a series of memory cells 61-1 through 61-N to the bit line BL-2 in response to the signal BST on the block select word line. The last memory cell 61-N in the series is connected to source select transistor 62 which couples the series to the source line SL in response to the signal SST on a source select word line.

In the alternative, the memory cells can be arranged as AND-type, NOR-type and virtual ground-type arrays often applied in flash memory devices.

Programming may be accomplished in the NAND array by applying incremental stepped pulse programming ISPP or other processes for inducing Fowler Nordheim tunneling. ISPP involves applying a stepped programming voltage, starting at a gate bias of for example about plus 15 V, and incrementing the voltage for each programming step by about 0.2 V. Each pulse can have a constant pulse width of about 10 µs for example. In variations of the technique, the pulse width and the increment applied for each succeeding pulse can be varied to meet the needs of the particular implementation. In alternative embodiments, the so-called voltage pulse self-boosting technique is applied for programming. Other biasing arrangements can be applied as well, selected for compatibility with array characteristics.

Other programming bias techniques can be applied. For NOR array structures, various biasing arrangements for inducing hot electron tunneling or FN tunneling may be applied as well as other techniques known in the art.

Figure 22:
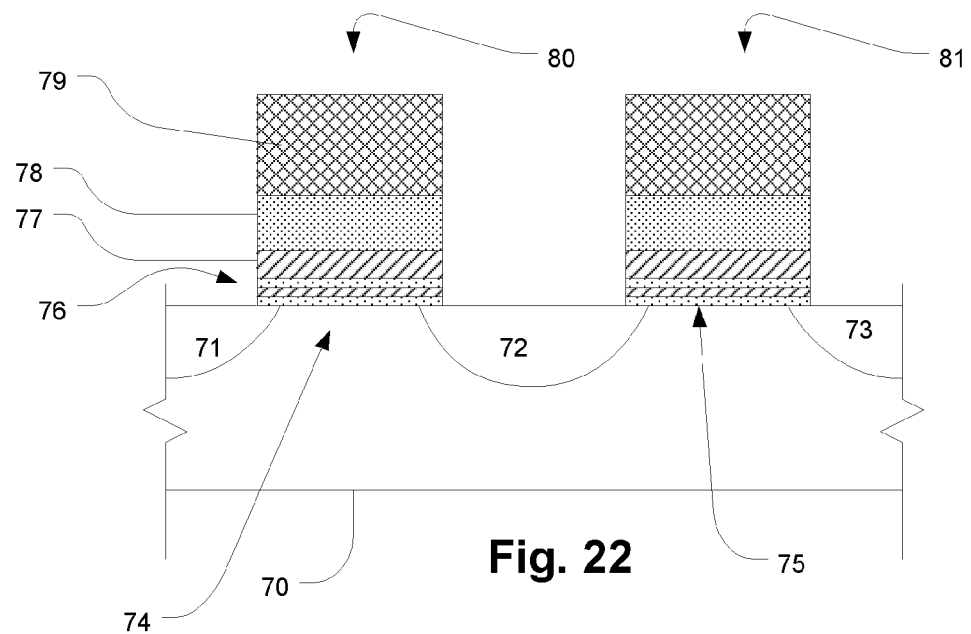
FIG. 22 is a simplified cross-sectional view of memory cells according to the present invention in a NAND configuration, taken perpendicular to word lines.
Figure 23:
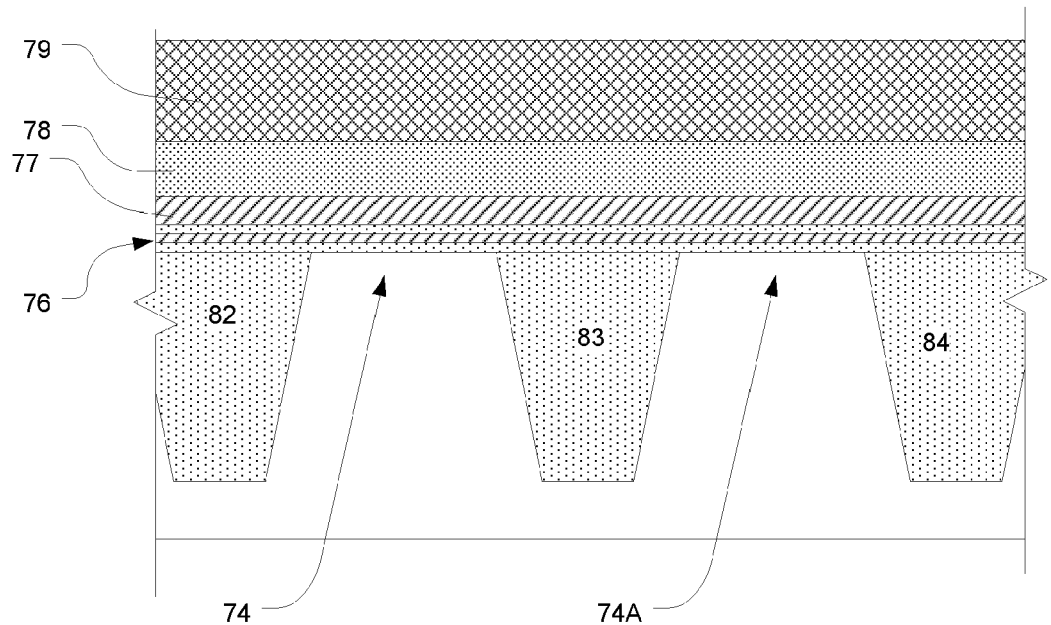
FIG. 23 is a simplified cross-sectional view of memory cells according to the present invention in a NAND configuration, taken through a word line.

FIGS. 22 and 23 show cross-sectional views of a representative memory cell structure as described herein implemented in a NAND-type array, taken across the word lines and along the word line respectively. FIG. 22 shows a semiconductor body 70 including channel regions 74, 75 and source/drain terminals 71, 72, 73 contacting the channel regions. The channel length between the source and drain terminals is preferably less than 50 nm, and in preferred embodiments 30 nm or less. The dielectric tunneling structure 76 like that described with reference to the layers 13-15 of FIG. 1, the charge trapping layer 77, the blocking dielectric layer 78 and a word line layer 79 are arranged in stacks 80 and 81 over the channel regions 74 and 75, respectively.

FIG. 23 shows the structure of FIG. 22 taken in cross section along a word line which includes the same stack with the same reference numerals as described with reference to FIG. 22. Columns of series connected cells are separated by shallow trench isolation STI structures 82, 83, 84. In the illustration, the surfaces of the channel 74, and of the adjacent channel 74A, are planar. Implementations of the device may include recessed (concave) channel surfaces in this cross-section, or extended (convex) channel surfaces, depending on the manufacturing techniques and the desired product. The multi-layer tunneling dielectric structure 76, including a SiON third layer, and the rest of the stack (layers 77, 78, 79) overlie the channel surfaces, whether planar, concave or convex, in a conformal manner. The channel width between the STI structures (e.g., 82, 83) is preferably less than 50 nm, and more preferably as small as the STI techniques allow.

Figure 24:
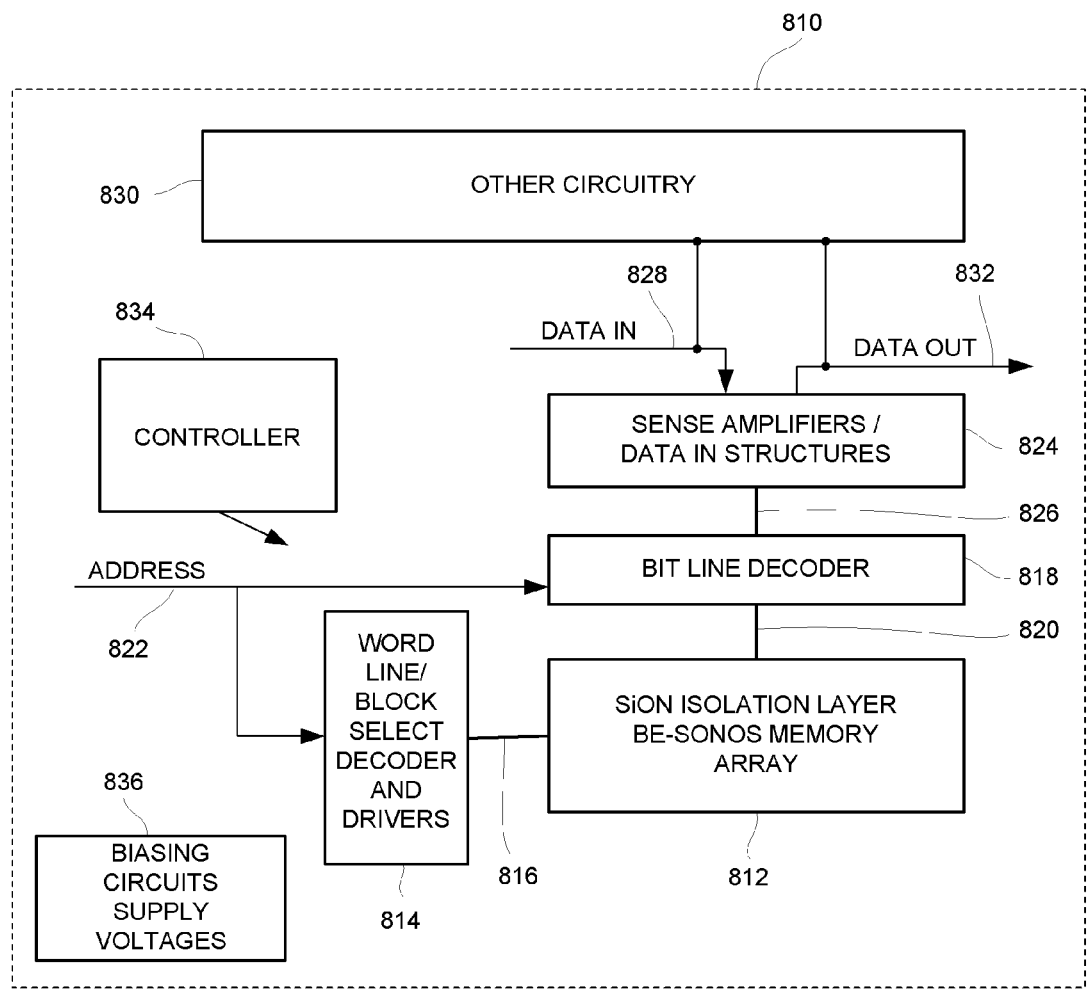
FIG. 24 is a block diagram of an integrated circuit memory employing memory cells and bias circuitry according to embodiments of the present invention.

FIG. 24 is a simplified block diagram of an integrated circuit employing blocking dielectric engineered BE-SONOS memory cells as described herein having a band gap engineered tunneling dielectric structure with on SiON isolation layer. The integrated circuit 810 includes a memory array 812 implemented using isolation layer dielectric engineered BE-SONOS memory cells as described herein on a semiconductor substrate. A word line (or row) and block select decoder 814 is coupled to, and in electrical communication with, a plurality 816 of word lines and block select lines, and arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Addresses are supplied on bus 822 to the word line decoder and drivers 814 and to the bit line decoder 818. Sense amplifiers and data-in structures in block 824, including current sources for the read, program and erase modes, are coupled to the bit line decoder 818 via data the bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

The array 812 can be a NAND array, an AND array or a NOR array, depending on the particular application. The very large memory window available supports storing multiple bits per cell, and thus multiple bit sense amplifiers can be included on the device.

A controller 834 implemented in this example, using bias arrangement state machine, controls the application of bias circuits and supply voltages 836, such as read, program, erase, erase verify, program verify voltages or currents for the word lines and bit lines, and controls the word line/source line operation using an access control process. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

A memory cell including the data storage structure described herein is capable of use in an operating mode in which an electric field across the data storage structure induces hole tunneling through the first layer sufficient to lower a threshold voltage of the memory cell by more than 4 Volts in less than one millisecond. In such embodiments, the control circuits including for example the controller 834 and bias circuits 836 coupled to the array of memory cells, apply bias voltages to selected memory cells for read, program and erase operations, including bias voltages during the erase operations across the data storage structure to induce said hole tunneling by applying an average electric field across the data storage structure between about 10 and 14 MV/cm.

The memory cells described herein have the data storage structure arranged with the tunneling dielectric structure contacting the channel in the semiconductor substrate. Alternative implementations can be arranged for gate side tunneling, with the tunneling dielectric structure contacting the gate, and the blocking layer contacting the channel.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A charge trapping memory comprising an array of memory cells, respective memory cells in the array including
a semiconductor body including a channel having a channel surface;
a gate; and
a data storage structure between the channel region and the gate, the data storage structure comprising a tunnel dielectric structure; a dielectric charge trapping layer on the tunnel dielectric structure; and a blocking dielectric layer on the charge trapping layer;
wherein the tunnel dielectric structure includes a first layer of silicon dioxide having a hole tunneling barrier height, a second layer of silicon nitride or silicon oxynitride having a hole tunneling barrier height less than that of the first layer, and a third layer of silicon oxynitride, the silicon oxynitride having a hole tunneling barrier height greater than that of the second layer and less than that of the first layer.

2. The memory of claim 1, wherein the third layer consists of silicon oxynitride having an index of refraction in an inclusive range from to 1.5 to 1.63 and has a thickness between about than 3 nanometers and 4 nanometers.

3. The memory of claim 1, wherein the third layer consists of silicon oxynitride having an index of refraction less than 1.72 and has a thickness greater than 2.5 nanometers.

4. The memory of claim 1, wherein the first layer has a thickness less than 1.5 nanometers, the second layer has a thickness less than 2.5 nanometers, and the third layer has a thickness greater than 2.5 nanometers.

5. The memory of claim 1, wherein the data storage structure is capable of use in an operating mode in which an electric field across the data storage structure induces hole tunneling through the first layer sufficient to lower a threshold voltage of the memory cell by more than 4 Volts in less than one millisecond, and including
control circuits and bias circuits coupled to the array of memory cells, to apply bias voltages to selected memory cells for read, program and erase operations, including bias voltages during the erase operations across the data storage structure to induce said hole tunneling.

6. The memory of claim 1, wherein the data storage structure is capable of use in an operating mode in which an electric field across the data storage structure induces hole tunneling through the first layer sufficient to lower a threshold voltage of the memory cell by more than 4 Volts in less than one millisecond, and including
control circuits and bias circuits coupled to the array of memory cells, to apply bias voltages to selected memory cells for read, program and erase operations, including to apply bias voltages across the data storage structure to induce an electric field having an average magnitude between 10 MV/cm and 14 MV/cm to induce said hole tunneling.

7. The memory of claim 1, wherein the first layer of the tunneling dielectric structure contacts the channel surface, and the gate comprises a conductive material having a work function equal to or greater than that of p+ doped polysilicon.

8. The memory of claim 1, wherein the first layer of the tunneling dielectric structure contacts the gate.

9. A charge trapping memory comprising an array of memory cells, respective memory cells in the array including
a semiconductor body including a channel having a channel surface;
a tunneling dielectric layer on the channel surface, including a first silicon oxide layer adjacent the channel and having a thickness of 2 nm or less, a silicon nitride layer on the first silicon oxide layer having a thickness of 3 nm or less, and a silicon oxynitride layer on the silicon nitride layer having a thickness of 2.5 nm or more;
a charge trapping layer on the tunnel dielectric layer comprising silicon nitride having a thickness of 5 nm or more;
a blocking dielectric layer on the charge trapping layer; and
a gate on the blocking dielectric layer.

10. The memory of claim 9, wherein the nitrogen concentration in the silicon oxynitride layer has an index of refraction in an inclusive range from to 1.5 to 1.63 and has a thickness between 3 nanometers and 4 nanometers.

11. The memory of claim 9, wherein the nitrogen concentration in the silicon oxynitride layer has an index of refraction less than 1.72 and the thickness of the silicon oxynitride layer is 3.5 nm or more.

12. The memory of claim 9, wherein the first silicon oxide layer is less than 1.5 nm thick, the silicon nitride layer is less than 2.5 nm thick, and the silicon oxynitride layer is more than 3 nm thick.

13. A method for manufacturing a charge trapping memory comprising:

defining a channel region on a semiconductor body, the channel region having a channel surface;

forming an dielectric stack, including forming a tunneling dielectric layer; forming a charge trapping dielectric layer; and forming a blocking dielectric layer, wherein said forming a tunneling dielectric layer includes forming a first layer of silicon dioxide or silicon oxynitride on a surface of the channel region by a thermal oxidation process, forming a second layer of silicon nitride or silicon oxynitride of the first layer by a low pressure chemical vapor deposition, and forming a third layer of silicon oxynitride on the second layer by a low pressure chemical vapor deposition;

the first layer having a hole tunneling barrier height, the second layer having a hole tunneling barrier height less than that of the first layer, and the third layer having a hole tunneling barrier height greater than that of the second layer and less than that of the first layer; and forming a gate over the dielectric stack.

14. The method of claim 13, wherein the first layer is formed using in-situ steam generation ISSG.

15. The method of claim 13, wherein the second layer is formed using dichlorosilane DCS and $NH_3$ precursors.

16. The method of claim 13, wherein the second layer is formed using dichlorosilane DCS and $N_2O$ precursors.

17. The method of claim 13, wherein the third layer consists of silicon oxynitride having an index of refraction in an inclusive range from to 1.5 to 1.63 and has a thickness between 3 nanometers and 4 nanometers.

18. The method of claim 13, wherein the third layer consists of silicon oxynitride having an index of refraction less than 1.72 and has a thickness greater than 2.5 nanometers.

19. The method of claim 13, wherein the first layer has a thickness less than 1.5 nanometers, the second layer has a thickness less than 2.5 nanometers, and the third layer has a thickness greater than 2.5 nanometers.

* * * * *

UNITED STATES PATENT AND TRADEMARK OFFICE
CERTIFICATE OF CORRECTION

| | | |
|---|---|---|
| PATENT NO. | : 8,169,835 B2 | Page 1 of 1 |
| APPLICATION NO. | : 12/568272 | |
| DATED | : May 1, 2012 | |
| INVENTOR(S) | : Jeng-Hwa Liao et al. | |

It is certified that error appears in the above-identified patent and that said Letters Patent is hereby corrected as shown below:

In claim 2, column 15, line 67, delete the word "than".

In claim 10, column 16, line 56, after the word "from" delete the word "to".

In claim 13, column 17, line 3, before the word "dielectric" delete the word "an" and insert the word -- a --.

Signed and Sealed this
Tenth Day of July, 2012

David J. Kappos
*Director of the United States Patent and Trademark Office*